United States Patent
Jahnke et al.

(10) Patent No.: US 10,371,726 B2
(45) Date of Patent: Aug. 6, 2019

(54) MONITORING SYSTEM FOR GROUNDING APPARATUS

(71) Applicant: CUTSFORTH, INC., Cohasset, MN (US)

(72) Inventors: David A. Jahnke, La Conner, WA (US); Robert S. Cutsforth, Bellingham, WA (US); Dustin L. Cutsforth, Kansas City, MO (US)

(73) Assignee: CUTSFORTH, INC., Cohasset, MN (US)

( * ) Notice: Subject to any disclaimer, the term of this patent is extended or adjusted under 35 U.S.C. 154(b) by 307 days.

(21) Appl. No.: 15/402,455

(22) Filed: Jan. 10, 2017

(65) Prior Publication Data

US 2017/0199232 A1    Jul. 13, 2017

Related U.S. Application Data

(60) Provisional application No. 62/277,166, filed on Jan. 11, 2016.

(51) Int. Cl.
*G01R 19/25* (2006.01)
*G01R 31/34* (2006.01)
(Continued)

(52) U.S. Cl.
CPC ........... *G01R 19/25* (2013.01); *G01R 31/343* (2013.01); *G05B 23/0235* (2013.01); *H02K 11/40* (2016.01)

(58) Field of Classification Search
CPC ..................................................... G01R 19/25
See application file for complete search history.

(56) References Cited

U.S. PATENT DOCUMENTS

| 1,307,028 A | 6/1919 | Sweet |
| 2,935,632 A | 5/1960 | Schmitz, Jr. |

(Continued)

FOREIGN PATENT DOCUMENTS

| AU | 2008256639 B2 | 2/2014 |
| CA | 2688007 A1 | 12/2008 |

(Continued)

OTHER PUBLICATIONS

International Search Report and Written Opinion dated Mar. 22, 2017 for International Application No. PCT/US2017/012802.

*Primary Examiner* — Manuel A Rivera Vargas
(74) *Attorney, Agent, or Firm* — Seager, Tufte & Wickhem LLP

(57) ABSTRACT

A shaft grounding and monitoring system may include a grounding member slidingly engageable with a rotating shaft. An electrical sensor may be configured to be coupled with the grounding member in order to detect an electrical parameter that provides an indication of electricity flowing from the rotating shaft to ground through the grounding member. A processor may be operably coupled with the electrical sensor and may receive and analyze data from the electrical sensor. The processor may be configured to periodically analyze the data representing the electrical parameter from the electrical sensor at a sampling rate and for a sampling period that is related to a rotation speed of the rotating shaft. A memory may be operably coupled with the processor and may be configured to store data processed by the processor that is representative of the data provided by the electrical sensor.

20 Claims, 11 Drawing Sheets

(51) Int. Cl.
  *G05B 23/02* (2006.01)
  *H02K 11/40* (2016.01)

(56) References Cited

U.S. PATENT DOCUMENTS

| | | |
|---|---|---|
| 3,523,288 A | 8/1970 | Thompson |
| 3,534,206 A | 10/1970 | Carey |
| 3,641,379 A | 2/1972 | Vick |
| 4,024,525 A | 5/1977 | Baumgartner et al. |
| 4,058,804 A | 11/1977 | Sawada et al. |
| 4,121,207 A | 10/1978 | Jones |
| 4,172,988 A | 10/1979 | Lowther |
| 4,272,695 A | 6/1981 | Buchwald et al. |
| 4,316,186 A | 2/1982 | Purdy et al. |
| 4,329,611 A | 5/1982 | Ohmstedt et al. |
| 4,329,683 A | 5/1982 | Kimberlin |
| 4,333,095 A | 6/1982 | Silva |
| 4,344,009 A | 8/1982 | Reynolds |
| 4,344,072 A | 8/1982 | Harper, Jr. |
| 4,348,608 A | 9/1982 | Michael |
| 4,390,870 A | 6/1983 | Michael |
| 4,400,638 A | 8/1983 | Albrecht et al. |
| 4,420,705 A | 12/1983 | Kimberlin |
| 4,488,078 A | 12/1984 | Orton |
| 4,513,495 A | 4/1985 | Kimberlin |
| 4,528,556 A | 7/1985 | Maddox |
| 4,528,557 A | 7/1985 | Braun |
| 4,536,670 A | 8/1985 | Mayer |
| 4,542,374 A | 9/1985 | Kollmannsberger et al. |
| 4,577,151 A | 3/1986 | Tanisaka et al. |
| 4,636,778 A | 1/1987 | Corkran et al. |
| 4,646,001 A | 2/1987 | Baldwin et al. |
| 4,652,783 A | 3/1987 | Cheesmore et al. |
| 4,723,084 A | 2/1988 | Reynolds |
| 4,739,208 A | 4/1988 | Kimberlin |
| 4,743,787 A | 5/1988 | Bunner et al. |
| 4,761,594 A | 8/1988 | Rodi et al. |
| 4,918,348 A | 4/1990 | Fitzsimmons et al. |
| 4,950,933 A | 8/1990 | Pipkin et al. |
| 4,977,345 A | 12/1990 | Toperzer |
| 5,229,817 A | 7/1993 | Lange et al. |
| 5,256,925 A | 10/1993 | Cutsforth |
| 5,327,184 A | 7/1994 | Nomura et al. |
| 5,387,831 A | 2/1995 | Yang |
| 5,397,952 A | 3/1995 | Decker et al. |
| 5,463,264 A | 10/1995 | Koenitzer |
| 5,488,261 A | 1/1996 | Swoboda et al. |
| 5,509,625 A | 4/1996 | Oullette et al. |
| 5,621,262 A | 4/1997 | Han |
| 5,731,650 A | 3/1998 | Scheucher |
| 5,739,619 A | 4/1998 | Thornley |
| 5,753,992 A | 5/1998 | Avitable et al. |
| 5,753,995 A | 5/1998 | Ogino |
| 5,870,026 A | 2/1999 | Challenger |
| 6,034,531 A | 3/2000 | Senglat et al. |
| 6,067,159 A | 5/2000 | Discenzo et al. |
| 6,111,643 A | 8/2000 | Discenzo et al. |
| 6,255,955 B1 | 7/2001 | Blaettner |
| 6,359,690 B1 | 3/2002 | Discenzo et al. |
| 6,495,940 B2 | 12/2002 | Kliman et al. |
| 6,552,467 B1 | 4/2003 | Suriano et al. |
| 6,580,511 B1 | 6/2003 | Discenzo |
| 6,598,597 B1 | 7/2003 | Marocco et al. |
| 6,731,042 B1 | 5/2004 | Bank et al. |
| 6,933,650 B2 | 8/2005 | Wang |
| 6,960,922 B2 | 11/2005 | Klaar |
| 6,966,754 B2 | 11/2005 | Wobben |
| 6,972,681 B2 | 12/2005 | Matsuoka et al. |
| 7,005,964 B2 | 2/2006 | Edmonson et al. |
| 7,010,959 B2 | 3/2006 | Dingfelder et al. |
| 7,034,430 B2 | 4/2006 | Cutsforth et al. |
| 7,045,929 B2 | 5/2006 | Yu |
| 7,049,532 B2 | 5/2006 | Kanazawa et al. |
| 7,102,379 B2 | 9/2006 | Hobelsberger et al. |
| 7,117,744 B2 | 10/2006 | Hobelsberger et al. |
| 7,122,935 B2 | 10/2006 | Custforth et al. |
| 7,141,906 B2 | 11/2006 | Cutsforth et al. |
| 7,212,010 B2 | 5/2007 | Hobelsberg |
| 7,218,028 B2 | 5/2007 | Annis et al. |
| 7,358,640 B2 | 4/2008 | Itou et al. |
| 7,417,354 B2 | 8/2008 | Custforth et al. |
| 7,485,882 B2 | 2/2009 | Zombo et al. |
| 7,545,072 B2 | 6/2009 | Cutsforth |
| 7,551,288 B1 | 6/2009 | Discenzo |
| 7,564,160 B2 | 7/2009 | Custforth et al. |
| 7,649,470 B2 | 1/2010 | Hobelsberger et al. |
| 7,705,744 B2 | 4/2010 | Cutsforth |
| 7,768,174 B2 | 8/2010 | Custforth et al. |
| 7,816,834 B2 | 10/2010 | Cutsforth |
| 7,880,362 B2 | 2/2011 | Cutsforth et al. |
| 7,880,363 B2 | 2/2011 | Custforth et al. |
| 7,916,038 B2 | 3/2011 | Cutsforth |
| 7,960,892 B2 | 6/2011 | Cutsforth |
| 7,990,018 B2 | 8/2011 | Custforth et al. |
| 7,994,683 B2 | 8/2011 | Custforth et al. |
| 8,047,083 B2 | 11/2011 | Puzio et al. |
| 8,054,190 B2 | 11/2011 | Hobelsberger |
| 8,084,704 B2 | 12/2011 | Mark et al. |
| 8,120,503 B2 | 2/2012 | Mark et al. |
| 8,134,472 B2 | 3/2012 | Cutsforth |
| 8,159,396 B2 | 4/2012 | Folden et al. |
| 8,165,552 B2 | 4/2012 | Rofougaran et al. |
| 8,179,014 B2 | 5/2012 | Custforth et al. |
| 8,384,266 B2 | 2/2013 | Fish et al. |
| 8,493,707 B2 | 7/2013 | Cutsforth |
| 8,618,943 B2 | 12/2013 | Cutsforth et al. |
| 8,825,800 B2 | 9/2014 | Cutsforth |
| 8,836,197 B2 | 9/2014 | Fish et al. |
| 8,972,219 B2 | 3/2015 | Schieke et al. |
| 9,013,087 B2 | 4/2015 | Fish et al. |
| 2001/0043022 A1 | 11/2001 | Narushima et al. |
| 2003/0011388 A1 | 1/2003 | Klaar |
| 2005/0116475 A1 | 6/2005 | Hibi et al. |
| 2005/0183504 A1 | 8/2005 | Hobelsberger et al. |
| 2005/0184751 A1 | 8/2005 | Hobelsberger et al. |
| 2005/0200378 A1 | 9/2005 | Hobelsberger et al. |
| 2006/0021775 A1 | 2/2006 | Duesselberg et al. |
| 2006/0043977 A1 | 3/2006 | Hobelsberger |
| 2007/0273165 A1 | 11/2007 | Beck et al. |
| 2008/0101895 A1 | 5/2008 | Holcomb et al. |
| 2008/0291273 A1 | 11/2008 | Cutsforth et al. |
| 2009/0096315 A1 | 4/2009 | Mantle |
| 2009/0153089 A1 | 6/2009 | Hobelsberger |
| 2009/0179663 A1* | 7/2009 | Hobelsberger ....... G01R 31/343 |
| | | 324/765.01 |
| 2009/0267782 A1 | 10/2009 | Mark et al. |
| 2011/0210837 A1* | 9/2011 | Jin .......................... F02N 11/10 |
| | | 340/438 |
| 2012/0169176 A1 | 7/2012 | Toledo et al. |
| 2012/0206010 A1 | 8/2012 | Kuban et al. |
| 2012/0248929 A1 | 10/2012 | Fish et al. |
| 2013/0034380 A1 | 2/2013 | Cutsforth |
| 2013/0057108 A1* | 3/2013 | Nair ....................... H02K 11/40 |
| | | 310/220 |
| 2013/0218514 A1 | 8/2013 | Schieke et al. |
| 2014/0009142 A1 | 1/2014 | Cauwenberghs et al. |
| 2014/0077960 A1 | 3/2014 | Cutsforth |
| 2014/0125206 A1 | 5/2014 | Fish et al. |
| 2014/0265675 A1 | 9/2014 | Cutsforth |
| 2015/0070810 A1 | 3/2015 | Cutsforth et al. |
| 2015/0357777 A1 | 12/2015 | Steinbach et al. |
| 2015/0357778 A1 | 12/2015 | Steinbach et al. |
| 2015/0357779 A1 | 12/2015 | Steinbach et al. |
| 2015/0357780 A1 | 12/2015 | Steinbach et al. |
| 2016/0352058 A1 | 12/2016 | Cutsforth et al. |

FOREIGN PATENT DOCUMENTS

| | | |
|---|---|---|
| CN | 1442683 | 9/2003 |
| DE | 3417711 A1 | 11/1985 |
| DE | 19755232 A1 | 6/1999 |
| DE | 202006003418 U1 | 5/2006 |
| DE | 102005062073 A1 | 7/2007 |
| DE | 102012102726 A1 | 10/2012 |

(56) References Cited

FOREIGN PATENT DOCUMENTS

| EP | 0099158 | A1 | 1/1984 |
|---|---|---|---|
| EP | 0920092 | A2 | 6/1999 |
| EP | 1090702 | A2 | 4/2001 |
| EP | 1271716 | A1 | 1/2003 |
| EP | 1090702 | B1 | 1/2004 |
| EP | 1439042 | A2 | 7/2004 |
| EP | 1441422 | A2 | 7/2004 |
| EP | 1801938 | A2 | 6/2007 |
| EP | 2151024 | B1 | 8/2013 |
| EP | 2642642 | A2 | 9/2013 |
| GB | 2172445 | A | 9/1986 |
| JP | 60039337 | A | 3/1985 |
| WO | 0069062 | A1 | 11/2000 |
| WO | 0219698 | A2 | 3/2002 |
| WO | 03052902 | A1 | 6/2003 |
| WO | 2007021425 | A1 | 2/2007 |
| WO | 2008148058 | A1 | 12/2008 |
| WO | 2008148060 | A2 | 12/2008 |
| WO | 2008148060 | A3 | 5/2009 |
| WO | 2012119832 | A1 | 9/2012 |
| WO | 2012123402 | A1 | 9/2012 |

\* cited by examiner

MONITORING SYSTEM FOR GROUNDING APPARATUS

RELATED APPLICATIONS

This application claims the benefit of U.S. Provisional Patent Application Ser. No. 62/277,166 entitled "MONITORING SYSTEM FOR GROUNDING APPARATUS" and filed Jan. 11, 2016, which application is hereby incorporated by reference in its entirety.

TECHNICAL FIELD

The disclosure generally relates to monitoring systems for monitoring one or more components of a device having a rotating shaft susceptible to having a stray electrical voltage on the shaft. More specifically, the disclosure relates to monitoring apparatus, assemblies, systems and methods of monitoring one or more components, such as a grounding apparatus, of a device having a rotating shaft having a stray electrical voltage on the shaft.

BACKGROUND

In many devices that include a rotating shaft, such as but not limited to electric generators, electric motors, gear boxes such as windmill gear boxes, compressors, pumps, and the like, stray voltage may build up on the rotating shaft. Apart from any stray voltages resulting from equipment that is not functioning correctly, all rotating shafts inherently generate electric fields from asymmetries in magnetic field distribution between rotor and stator, residual magnetic flux in the shaft, excitation and electrostatic charges. These stray voltages may ultimately exit the rotating shaft through structures such as the bearings supporting the rotating shaft. Over time, this can damage the bearings and/or other components of the device.

In order to prevent current flow through structures like bearings and related components, a grounding apparatus may be used to ground the rotating shaft. Such grounding apparatus may include grounding brushes, grounding straps, grounding ropes and other grounding members configured to ground the rotating shaft of the device. In maritime applications, propulsion shafts may include a grounding apparatus in order to avoid galvanic activity that can otherwise cause erosion. There is a desire to monitor the performance of the grounding apparatus to ensure that the grounding apparatus is performing correctly. There is also a desire to monitor electrical current flowing through the grounding apparatus in order to detect and diagnose potential defects or other problems within the device.

SUMMARY

The disclosure is directed to several alternate designs, materials and methods of monitoring the performance of a grounding apparatus for an electric generator, an electric motor, a gearbox, a compressor, a pump, a drive shaft, an axle, or other device including a rotating shaft subject to stray electrical voltage on the shaft.

Accordingly, an illustrative embodiment of the disclosure is a shaft grounding and monitoring system for a device having a rotating shaft. The shaft grounding and monitoring system includes a grounding member configured to make sliding electrical contact with the rotating shaft, the grounding member configured to be connected to ground. An electrical sensor is configured to sense an electrical parameter that provides an indication of electricity flowing through the grounding member. A processor is operably coupled with the electrical sensor and is configured to receive and analyze data from the electrical sensor representing the electrical parameter. The processor is further configured to periodically analyze the data representing the electrical parameter from the electrical sensor for a sampling period that is related to a rotation speed of the rotating shaft. A memory is operably coupled with the processor and is configured to store data processed by the processor that is representative of the data provided by the electrical sensor.

Additionally or alternatively to any above embodiment, the electrical sensor comprises an electrical current sensor.

Additionally or alternatively to any above embodiment, the electrical sensor comprises an electrical voltage sensor.

Additionally or alternatively to any above embodiment, the electrical sensor detects the electrical parameter at a sampling rate that provides enough data points per second to capture any anomalous or threshold condition that may be occurring in the device.

Additionally or alternatively to any above embodiment, the sampling period is equal to or greater than one complete revolution of the rotating shaft.

Additionally or alternatively to any above embodiment, the processor is further configured to not analyze the data representing the electrical parameter for a period of time immediately after the sampling period.

Additionally or alternatively to any above embodiment, the period of time immediately after the sampling period is longer than the sampling period.

Additionally or alternatively to any above embodiment, the processor is configured to analyze the data representing the electrical parameter from the electrical sensor for a sampling period ranging from 0.01 seconds per each second to 0.5 seconds per each second, and the processor is configured to not analyze the data representing the electrical parameter from the electrical sensor for a subsequent time period ranging from 0.5 seconds per each second to 0.99 seconds per each second.

Additionally or alternatively to any above embodiment, the processor is configured to analyze the data representing the electrical parameter from the electrical sensor for a sampling period ranging from 0.05 seconds per each second to 0.25 seconds per each second, and the processor is configured to not analyze the data representing the electrical parameter from the electrical sensor for a subsequent time period ranging from 0.75 seconds per each second to 0.95 seconds per each second.

Additionally or alternatively to any above embodiment, the processor is configured to analyze the data representing the electrical parameter from the electrical sensor for a sampling period of 0.1 seconds per each second, and the processor is configured to not analyze the data representing the electrical parameter from the electrical sensor for a subsequent time period of 0.9 seconds per each second.

Another illustrative embodiment of the disclosure is a shaft grounding and monitoring system for a device having a rotating shaft. The shaft grounding and monitoring system includes a grounding member that is configured to slidingly contact the rotating shaft and make electrical contact with the rotating shaft, the grounding member configured to be connected to a source of ground. An isolated contact member is configured to slidingly contact the rotating shaft and is electrically isolated from ground. A current sensor is configured to be coupled with the grounding member in order to sense an electrical current flowing from the rotating shaft to ground through the grounding member and is configured to sample at a first sampling rate. A voltage sensor is configured to be coupled with the isolated contact member in order to sense an electrical voltage in the shaft and is configured to periodically sample at a second sampling rate. A processor is operably coupled with the current sensor and with the voltage sensor and is configured to receive data from the current sensor and the voltage sensor. The processor is configured to analyze data from the current sensor and from the voltage sensor. A memory is operably coupled with the processor and is configured to store current sensor data processed by the processor that is representative of data provided by the current sensor and voltage data processed by the processor that is representative of data provided by the voltage sensor.

Additionally or alternatively to any above embodiment, the second sampling rate is higher than the first sampling rate.

Additionally or alternatively to any above embodiment, the grounding member comprises a first grounding rope.

Additionally or alternatively to any above embodiment, the first grounding rope comprises a plurality of conductive wires secured together.

Additionally or alternatively to any above embodiment, the isolated contact member comprises a second grounding rope that is not electrically connected to ground.

Additionally or alternatively to any above embodiment, the first sampling rate is about 100,000 kHz or greater.

Additionally or alternatively to any above embodiment, the voltage sensor is configured to sample for only a portion of each second.

Additionally or alternatively to any above embodiment, the portion of each second is about one-tenth of each second.

Additionally or alternatively to any above embodiment, the second sampling rate is about 20 MHz or more when sampling.

Additionally or alternatively to any above embodiment, the second sampling rate is about 40 MHz or more when sampling.

Additionally or alternatively to any above embodiment, the processor is further configured to analyze a snapshot of data from the current sensor during a sampling period in order to identify a potential anomalous or threshold condition.

Additionally or alternatively to any above embodiment, if the processor does not identify a potential anomalous or threshold condition from the snapshot of data from the current sensor, the processor is further configured to store one or more values representative of the snapshot of data from the current sensor to memory.

Additionally or alternatively to any above embodiment, if the processor does identify a potential anomalous or threshold condition from the snapshot of data from the current sensor, the processor is further configured to store one or more values representative of the snapshot of data from the current sensor to memory and to analyze a snapshot of data from the voltage sensor in order to provide additional information regarding the potential anomalous or threshold condition, the snapshot of data from the voltage sensor at least partially temporally aligned with the snapshot of data from the current sensor.

Additionally or alternatively to any above embodiment, the current sensor comprises a Hall effect sensor.

Another illustrative embodiment of the disclosure is a monitoring system for a device having a rotating shaft and a grounding member positioned in electrical contact with the rotating shaft. The monitoring system includes a current sensor configured to sense an electrical current flowing through the grounding member and configured to sample at a first sampling rate for a first time interval. A voltage sensor is configured to sense an electrical voltage in the rotating shaft and is configured to periodically sample at a second sampling rate for a second time interval, wherein the second sampling rate is higher than the first sampling rate and the first time interval is longer than the second time interval and overlaps with the second time interval. A processor is operably coupled with the current sensor and with the voltage sensor and is configured to receive data from the current sensor and the voltage sensor. The processor is configured to analyze data indicative of electrical current sensed by the current sensor and data indicative of electrical voltage sensed by the voltage sensor. A memory is operably coupled with the processor and is configured to store information representative of the data from the current sensor and the data from the voltage sensor.

Additionally or alternatively to any above embodiment, the first sampling rate is about 100 kHz or greater.

Additionally or alternatively to any above embodiment, the voltage sensor is configured to sample for only a portion of each second.

Additionally or alternatively to any above embodiment, the portion of each second is about one-tenth of each second.

Additionally or alternatively to any above embodiment, the second sampling rate is about 20 MHz or more when sampling.

Additionally or alternatively to any above embodiment, the second sampling rate is about 40 MHz or more when sampling.

Additionally or alternatively to any above embodiment, the processor is further configured to analyze a snapshot of data from the current sensor during a sampling period in order to identify a potential anomalous or threshold condition.

Additionally or alternatively to any above embodiment, if the processor does not identify a potential anomalous or threshold condition from the snapshot of data from the current sensor, the processor is further configured to store one or more values representative of the snapshot of data from the current sensor to memory.

Additionally or alternatively to any above embodiment, if the processor does identify a potential anomalous or threshold condition from the snapshot of data from the current sensor, the processor is further configured to store one or more values representative of the snapshot of data from the current sensor to memory and to analyze a temporally aligned snapshot of data from the voltage sensor in order to provide additional information regarding the potential anomalous or threshold condition.

Another illustrative embodiment of the disclosure is a method of monitoring a rotating conductive shaft in a device, the device including a grounding apparatus. Data is received at a first sampling rate during a first sampling period from a current sensor that is operably coupled with the grounding apparatus. Data is periodically received at a second sampling rate during a second sampling period from a voltage sensor configured to sense a voltage within the rotating shaft, the second sampling rate being higher than the first sampling rate. A snapshot of data from the current sensor is analyzed to identify a potential anomalous or threshold condition. If a potential anomalous or threshold condition is seen in the data from the current sensor, a snapshot of data from the voltage sensor is analyzed. The snapshot of data from the voltage sensor that is analyzed is at least partially temporally aligned with the snapshot of data from the current sensor that was analyzed.

Additionally or alternatively to any above embodiment, if a potential anomalous or threshold condition is seen in the snapshot of data from the current sensor, storing the snapshot of data from the current sensor for future analysis.

Additionally or alternatively to any above embodiment, if a potential anomalous or threshold condition is not seen in the snapshot of data from the current sensor, storing representative information pertaining to the snapshot of data from the current sensor to memory.

Additionally or alternatively to any above embodiment, further comprising analyzing the snapshot of data from the voltage sensor even if analysis of the snapshot of data from the current sensor does not indicate a potential anomalous or threshold condition.

Additionally or alternatively to any above embodiment, the potential anomalous or threshold condition is indicated by a sensed electrical current value that exceeds a threshold.

Additionally or alternatively to any above embodiment, the potential anomalous or threshold condition is indicated by an external request for analysis.

Additionally or alternatively to any above embodiment, representative information pertaining to the snapshot of data from the current sensor comprises an average electrical current and/or a peak electrical current.

Additionally or alternatively to any above embodiment, the first sampling rate is about 100 kHz or more.

Additionally or alternatively to any above embodiment, data is periodically received from the voltage sensor for only a portion of each second.

Additionally or alternatively to any above embodiment, the portion of each second is about one-tenth of each second.

Additionally or alternatively to any above embodiment, the second sampling rate is about 20 MHz or more when sampling.

Additionally or alternatively to any above embodiment, the second sampling rate is about 40 MHz or more when sampling.

Additionally or alternatively to any above embodiment, the first sampling period is equal to or greater than one complete revolution of the rotating shaft.

Additionally or alternatively to any above embodiment, the second sampling period is less than the first sampling period.

Additionally or alternatively to any above embodiment, the second sampling period is about one-tenth of the first sampling period.

Additionally or alternatively to any above embodiment, the first sampling period overlaps the second sampling period.

Additionally or alternatively to any above embodiment, the second sampling period falls entirely within the first sampling period.

Another illustrative embodiment of the disclosure is a shaft monitoring system for a device having a rotating shaft. The shaft monitoring system includes a conductive member that is configured to make sliding electrical contact with the rotating shaft. An electrical sensor is configured to be coupled with the conductive member in order to detect an electrical parameter that is associated with the rotating shaft. A processor is operably coupled with the electrical sensor and is configured to receive and analyze data from the electrical sensor representing the electrical parameter. The processor is further configured to periodically analyze the data representing the electrical parameter from the electrical sensor at a sampling rate and for a sampling period that is related to a rotation speed of the rotating shaft. A memory is operably coupled with the processor and configured to store data processed by the processor that is representative of the data provided by the electrical sensor.

Additionally or alternatively to any above embodiment, the electrical sensor comprises an electrical current sensor.

Additionally or alternatively to any above embodiment, the electrical sensor comprises an electrical voltage sensor.

Additionally or alternatively to any above embodiment, the electrical sensor detects the electrical parameter at a sampling rate that provides enough data points per second to capture any anomalous or threshold condition that may be occurring in the device.

Additionally or alternatively to any above embodiment, the sampling period is equal to or greater than one complete revolution of the rotating shaft.

Additionally or alternatively to any above embodiment, the processor is further configured to not analyze the data representing the electrical parameter for a period of time immediately after the sampling period, the period of time being longer than the sampling period.

Additionally or alternatively to any above embodiment, further comprising a second electrical sensor configured to detect a second electrical parameter associated with the rotating shaft.

Additionally or alternatively to any above embodiment, the processor is operably coupled with the second electrical sensor and is further configured to receive and analyze data from the second electrical sensor representing the second electrical parameter.

Additionally or alternatively to any above embodiment, the processor is further configured to analyze the data from the second electrical sensor at a second sampling rate and for a second sampling period that at least partially temporally overlaps the sampling period.

Additionally or alternatively to any above embodiment, the second electrical sensor is configured to be coupled with the conductive member.

Another illustrative embodiment of the disclosure is a method of monitoring stray electricity in a rotating conductive shaft in a device. The method includes receiving data of a first electrical parameter at a first sampling rate during a first sampling period and periodically receiving data of a second electrical parameter at a second sampling rate during a second sampling period. The second sampling rate is higher than the first sampling rate. Thereafter, a snapshot of data of the first electrical parameter is analyzed to identify a potential anomalous or threshold condition. If a potential anomalous or threshold condition is seen in the snapshot of date of the first electrical parameter, analyzing a snapshot of data of the second electrical parameter is then analyzed. The snapshot of data of the second electrical parameter that is analyzed at least partially temporally aligns with the snapshot of data of the first electrical parameter that was analyzed.

Additionally or alternatively to any above embodiment, the first electrical parameter is an electrical current.

Additionally or alternatively to any above embodiment, the electrical current is sensed by an electrical current sensor or the electrical current is calculated based on measured voltage.

Additionally or alternatively to any above embodiment, the second electrical parameter is an electrical voltage.

Additionally or alternatively to any above embodiment, the electrical voltage is sensed by an electrical voltage sensor or the electrical voltage is calculated based on measured current.

Additionally or alternatively to any above embodiment, if a potential anomalous or threshold condition is seen in the snapshot of data of the first electrical parameter, storing the snapshot of data of the first electrical parameter for future analysis.

Additionally or alternatively to any above embodiment, if a potential anomalous or threshold condition is not seen in the snapshot of the first electrical parameter, storing representative information pertaining to the snapshot of the first electrical parameter to memory.

Additionally or alternatively to any above embodiment, further comprising analyzing the snapshot of data of the second electrical parameter even if analysis of the snapshot of data of the first electrical parameter does not indicate a potential anomalous or threshold condition.

Additionally or alternatively to any above embodiment, the potential anomalous or threshold condition is indicated by a sensed electrical current value that exceeds a threshold.

Additionally or alternatively to any above embodiment, the potential anomalous or threshold condition is indicated by an external request for analysis.

Additionally or alternatively to any above embodiment, representative information pertaining to the snapshot of data of the first electrical parameter comprises an average electrical current and/or a peak electrical current.

Additionally or alternatively to any above embodiment, the first sampling rate is about 100 kHz or more.

Additionally or alternatively to any above embodiment, data of the second electrical parameter is periodically received for only a portion of each second.

Additionally or alternatively to any above embodiment, the portion of each second is about one-tenth of each second.

Additionally or alternatively to any above embodiment, the second sampling rate is about 20 MHz or more when sampling.

Additionally or alternatively to any above embodiment, the second sampling rate is about 40 MHz or more when sampling.

Additionally or alternatively to any above embodiment, the first sampling period is equal to or greater than one complete revolution of the rotating shaft.

Additionally or alternatively to any above embodiment, the second sampling period is less than the first sampling period.

Additionally or alternatively to any above embodiment, the second sampling period is about one-tenth of the first sampling period.

Additionally or alternatively to any above embodiment, the first sampling period overlaps the second sampling period.

Additionally or alternatively to any above embodiment, the second sampling period falls entirely within the first sampling period.

The above summary of some embodiments is not intended to describe each disclosed embodiment or every implementation of the present disclosure. The Figures, and Detailed Description, which follow, more particularly exemplify some of these embodiments.

BRIEF DESCRIPTION OF THE DRAWINGS

The invention may be more completely understood in consideration of the following detailed description of various embodiments in connection with the accompanying drawings, in which.

Figure 1:
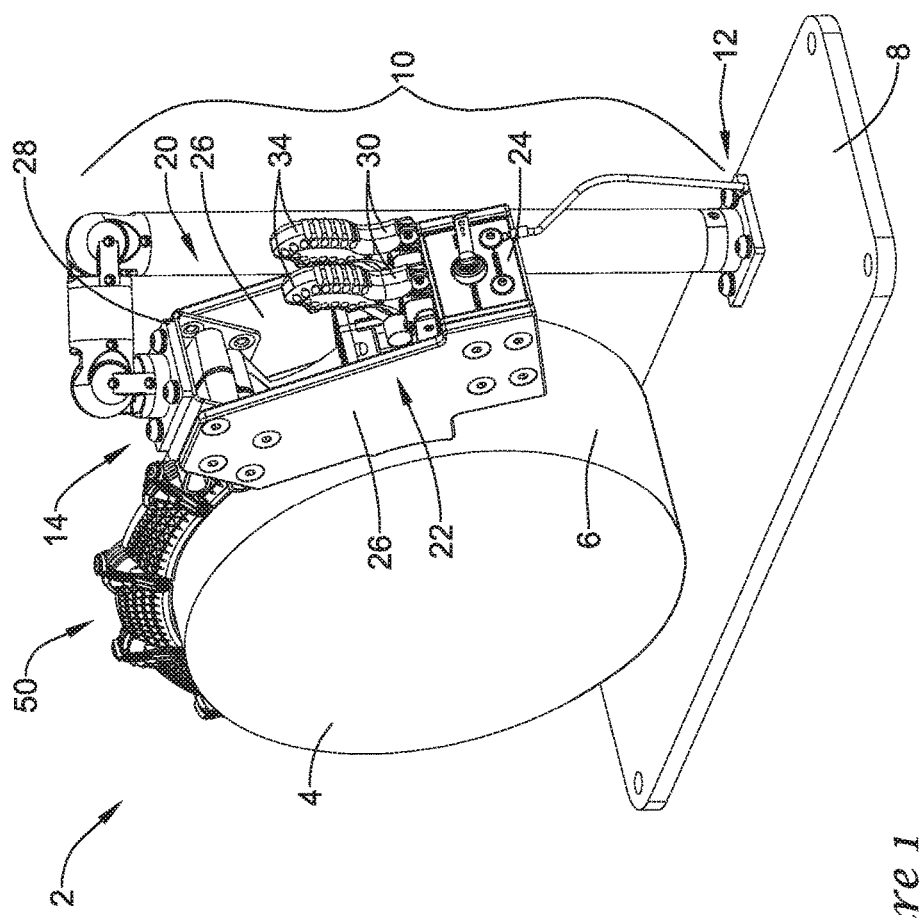
FIG. 1 is a perspective view of a portion of a rotating mechanism of an electric machine having a shaft grounding apparatus positioned on the shaft.

While the invention is amenable to various modifications and alternative forms, specifics thereof have been shown by way of example in the drawings and will be described in detail. It should be understood, however, that the intention is not to limit aspects of the invention to the particular embodiments described. On the contrary, the intention is to cover all modifications, equivalents, and alternatives falling within the spirit and scope of the invention.

DETAILED DESCRIPTION

For the following defined terms, these definitions shall be applied, unless a different definition is given in the claims or elsewhere in this specification.

All numeric values are herein assumed to be modified by the term "about," whether or not explicitly indicated. The term "about" generally refers to a range of numbers that one of skill in the art would consider equivalent to the recited value (i.e., having the same function or result). In many instances, the terms "about" may include numbers that are rounded to the nearest significant figure.

The recitation of numerical ranges by endpoints includes all numbers within that range (e.g. 1 to 5 includes 1, 1.5, 2, 2.75, 3, 3.80, 4, and 5).

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include one or more particular features, structures, and/or characteristics. However, such recitations do not necessarily mean that all embodiments include the particular features, structures, and/or characteristics. Additionally, when particular features, structures, and/or characteristics are described in connection with one embodiment, it should be understood that such features, structures, and/or characteristics may also be used connection with other embodiments whether or not explicitly described unless clearly stated to the contrary.

The following detailed description should be read with reference to the drawings in which similar structures in different drawings are numbered the same. The drawings, which are not necessarily to scale, depict illustrative embodiments and are not intended to limit the scope of the disclosure.

A variety of devices include a rotating shaft that makes contact with a stationary or largely stationary electrical conductor. Examples include but are not limited to electric machines such as dynamo-electric machines including electrical generators and electrical motors. For illustrative purposes, the disclosure will make reference to an electrical machine (e.g., an electrical generator), but it will be appreciated that the concepts discussed herein are equally applicable to other equipment as well. Additional examples of devices having a rotating shaft include gearboxes, such as a windmill gearbox, pumps, compressors, drive shafts, axles, and the like. Maritime propulsion systems also utilize a rotating shaft. FIGS. 1 through 5 provide illustrative views of an electric machine 2 that may incorporate a shaft grounding and monitoring system. In some instances, a monitoring system that is configured to monitor the performance of a shaft grounding system, and thus monitor the health of the electric machine 2, may be built into a shaft grounding system such as that described herein. In some cases, a monitoring system may, for example, be an add-on or retro-fit system that may be added to an existing shaft grounding apparatus or may be included with a shaft grounding apparatus installed on the electric machine 2. In other instances, the shaft monitoring system may be utilized independent of any shaft grounding apparatus.

FIG. 1 illustrates a portion of an electric machine 2 having a rotating mechanism, such as a rotating shaft 4. The electric machine 2 may be a dynamo-electric machine, such as an electric generator which converts mechanical energy into electrical energy, or an electric motor which converts electrical energy into mechanical energy. Accordingly, the rotating shaft 4 may be connected to, but electrically isolated from, a collector ring, or similar structure, of an electric generator or a commutator, or similar structure of an electric motor adapted and configured to interact with or be a part of a sliding connection to complete an electrical circuit between a fixed and a moving conductor to pass electrical current therebetween. For example, in at least some generators or motors, the collector rings or commutators are adapted and configured to complete a circuit with brush assemblies or riggings within the generator or motor. The rotating shaft 4 may transfer mechanical energy from a power source to the collector ring of an electrical generator and/or transfer mechanical energy from a commutator of an electric motor. Those of skill in the art will recognize that the size and configuration of the rotating shaft 4 may vary, depending on the type and/or size of the generator or motor in which the rotating shaft 4 is used. For example, in some industrial applications, the rotating shaft 4 may have a diameter of 10 inches or more, 12 inches or more, 14 inches or more, 16 inches or more, 18 inches or more, 20 inches or more, 22 inches or more, or 24 inches or more. In other applications, the rotating shaft 4 may have a diameter of 10 inches or less, 8 inches or less, or 6 inches or less.

The rotating shaft 4, a portion of which is illustrated in FIG. 1, may be an elongate cylindrical shaft having an electrically conductive outer peripheral surface 6 configured to be in sliding electrical contact with a grounding apparatus. Although made of conductive metal, electricity is not intended to pass through the rotating shaft 4 and stray electrical voltages in the rotating shaft 4 may damage components of the electrical device, such as bearings, etc., particularly as these stray voltages attempt to pass through these components. In some instances, a shaft grounding apparatus 20 may be positioned proximate the rotating shaft 4 to ground the rotating shaft 4. One such shaft grounding apparatus 20 is further described in and relates to the subject matter contained in U.S. Pat. No. 8,493,707 entitled GROUNDING ROPE GUIDE FOR A DYNAMO-ELECTRIC MACHINE filed on Aug. 5, 2011, which is expressly incorporated herein by reference in its entirety.

A mounting fixture 10 may be used to position the shaft grounding apparatus 20 in close proximity to the rotating shaft 4. In some instances, the mounting fixture 10 may include a first end 12 mounted to a base 8, or other stationary structure, and a second end 14 mounted to the shaft grounding apparatus 20. One such mounting fixture 10, is further described in and relates to the subject matter contained in the U.S. patent application Ser. No. 13/204,176 entitled MOUNTING FIXTURE INCLUDING AN ARTICULATION JOINT filed on Aug. 5, 2011 and published as U.S. Patent App. No. 2013/0034380, which is expressly incorporated herein by reference in its entirety. However, it is understood that the mounting fixture 10 may be of any desired configuration to position the shaft grounding apparatus 20 in close proximity to the rotating shaft 4.

The shaft grounding apparatus 20 may include an electrical box 22 housing components of the shaft grounding apparatus 20. For example, the electrical box 22 may include one or more, or a plurality of brush holders 30 including brushes 32 in electrical contact with the electrically conductive peripheral surface 6 of the rotating shaft 4. The brush holders 30 may also include a handle 34 for removing the brush holder 30 from the electrical box 22. In some instances, the brush holders 30 may be similar to those described in U.S. Pat. No. 7,034,430. The electrical box 22 may also include a control box 24 for controlling the flow of electricity from the electrical box 22.

The shaft grounding apparatus 20 may also include a rope guide 50 extending from the electrical box 22. For example, the electrical box 22 may include first and second side panels 26 secured (e.g., bolted) to a mount 28 of the mounting fixture 10 and to the rope guide 50.

Figure 2:
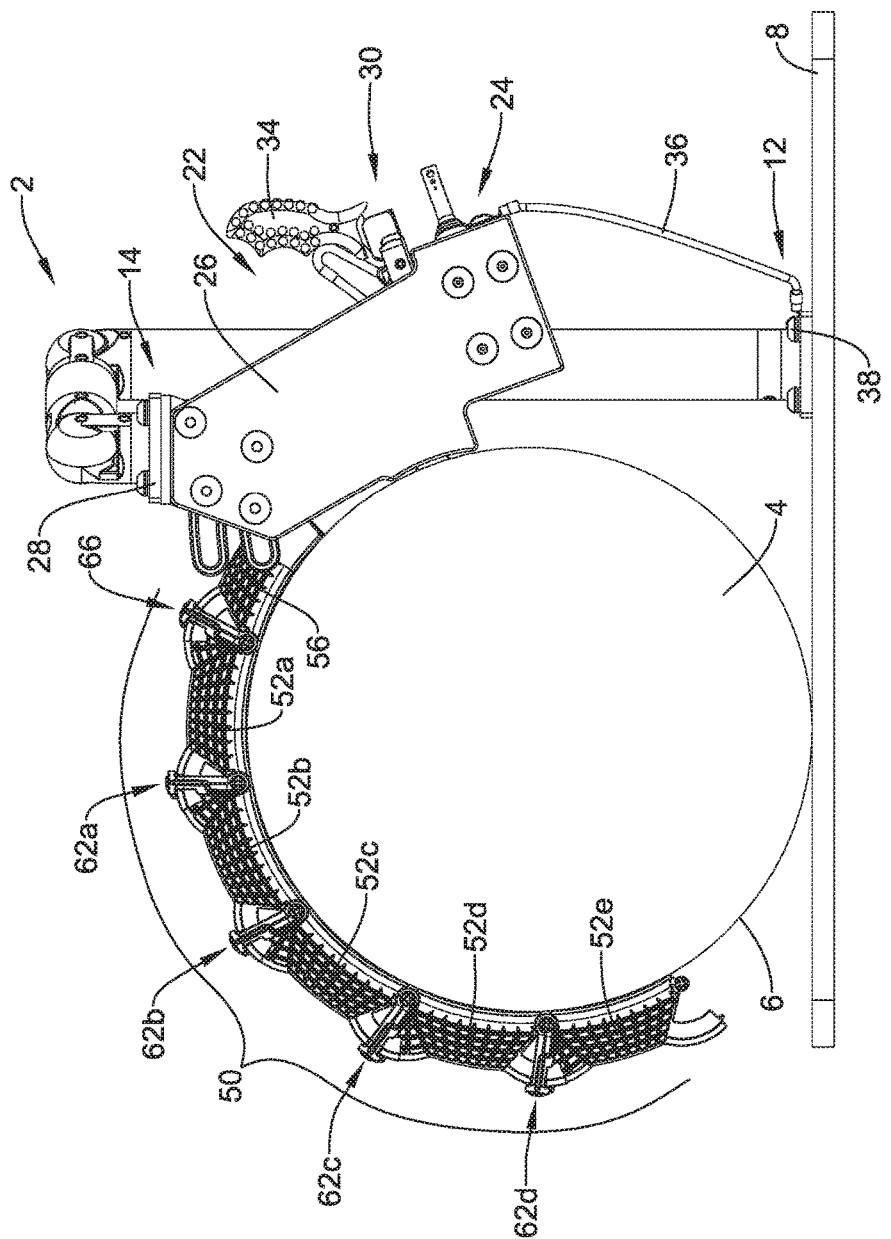
FIG. 2 is a side view of the shaft grounding apparatus of FIG. 1 positioned around the shaft of an electric machine.
Figure 3:
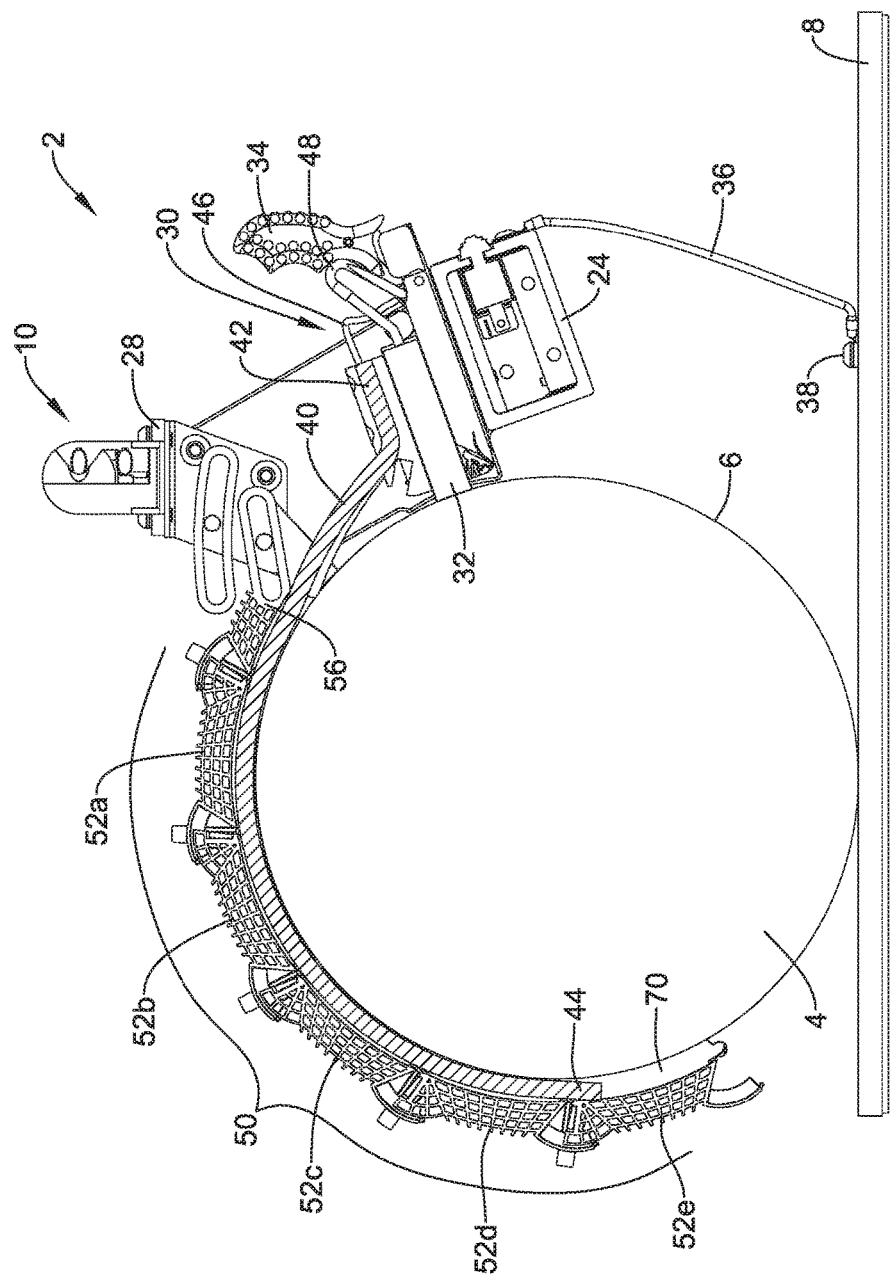
FIG. 3 is a cross-sectional view of the shaft grounding apparatus of FIG. 1 positioned around the shaft of an electric machine.

Turning to FIGS. 2 and 3, the rope guide 50 may be an adjustable rope guide configured to guide a grounding member, such as a grounding rope 40 on the electrically conductive surface 6 of the rotating shaft 4. For instance, the adjustable rope guide 50 may be adjustable between a first position having a first radius of curvature and a second position having a second radius of curvature greater than the first radius of curvature to provide the adjustable rope guide 50 with a variable radius of curvature to closely follow a radius of curvature of the rotating shaft 4. In some embodiments, the adjustable rope guide 50 may include a connector segment 56 and a plurality of articulating segments 52 configured to provide the adjustable rope guide 50 with a variable radius of curvature to closely follow a radius of curvature of the rotating shaft 4. In some embodiments, the connector segment 56 and/or the articulating segments 52 may be formed of a polymeric material, such as injection molded of a polymeric material, making the components of the rope guide 50 electrically insulated.

Depending on the diameter of the rotating shaft 4, and thus the length of the grounding rope 40, the rope guide 50 may include one, two, three, four, five, six or more articulating segments 52 pivotably coupled together at hinge points 62. For example, the illustrated rope guide 50 includes a first articulating segment 52a, a second articulating segment 52b, a third articulating segment 52c, a fourth articulating segment 52d, and a fifth articulating segment 52e, with a first hinge point 62a between the first and second articulating segments 52a, 52b, a second hinge point 62b between the second and third articulating segments 52b, 52c, a third hinge point 62c between the third and fourth articulating segments 52c, 52d, and a fourth hinge point 62d between the fourth and fifth articulating segments 52d, 52e. The first articulating segment 52a may also be pivotably coupled to the connector segment 56 at a hinge point 66. One such adjustable grounding rope guide is further described in and relates to the subject matter contained in the U.S. Pat. No. 8,493,707 entitled GROUNDING ROPE GUIDE FOR A DYNAMO-ELECTRIC MACHINE filed on Aug. 5, 2011, which is expressly incorporated by reference herein in its entirety.

The electrical pathway for grounding the rotating shaft 4 may be further understood with reference to FIG. 3. The electrical pathway may include a grounding member, such as the grounding rope 40, formed of a conductive material, such as copper or a copper alloy. The grounding rope 40, which extends through a channel 70 of the rope guide 50, may be positioned against the conductive surface 6 of the rotating shaft 4 such that the rotating shaft 4 slides against the grounding rope 40 as the rotating shaft 4 is rotating. The grounding rope 40 may be formed of a plurality of twisted multi-filar strands of conductive material, such as copper, or a copper alloy wires. It will be appreciated that the twisted multi-filar strands may provide a self-cleaning functionality as the rotating shaft 4 slides relative to the grounding rope 40. In other instances, the grounding rope 40 may have a different configuration. As used herein, the term "grounding rope" includes alternative configurations of a conductive grounding member such as a cable, wire, braid, band, strap or other elongate electrically conductive structure.

The grounding rope 40 may include a first end 42 coupled to a component in the electrical box 22 and a second end 44 hanging over the rotating shaft 4 in the direction of rotation of the rotating shaft 4. In some instances, the grounding rope 40 may have a length such that about 1 to 2 inches of the grounding rope 40 extends along the tangent line beyond the tangent between the conductive surface 6 and the grounding rope 40.

In some embodiments, the first end 42 of the grounding rope 40 may be secured to a rope holder 30 in the electrical box 22. For example, the first end 42 of the grounding rope 40 may be clamped between two plates of the rope holder 30 in some instances. From the terminal of the rope holder 30, the electrical pathway may pass through the control box 24 to a grounding wire 36 to ground 38. Thus, the grounding rope 40 may be connected to ground 38 through the electrical pathway passing through the electrical box 22, and thus grounded. In other embodiments, the first end 42 of the grounding rope 40 may be attached directly to ground 38 (e.g., a grounding post), or another component electrically coupled to ground 38, without being attached to the rope holder 30.

Figure 4:
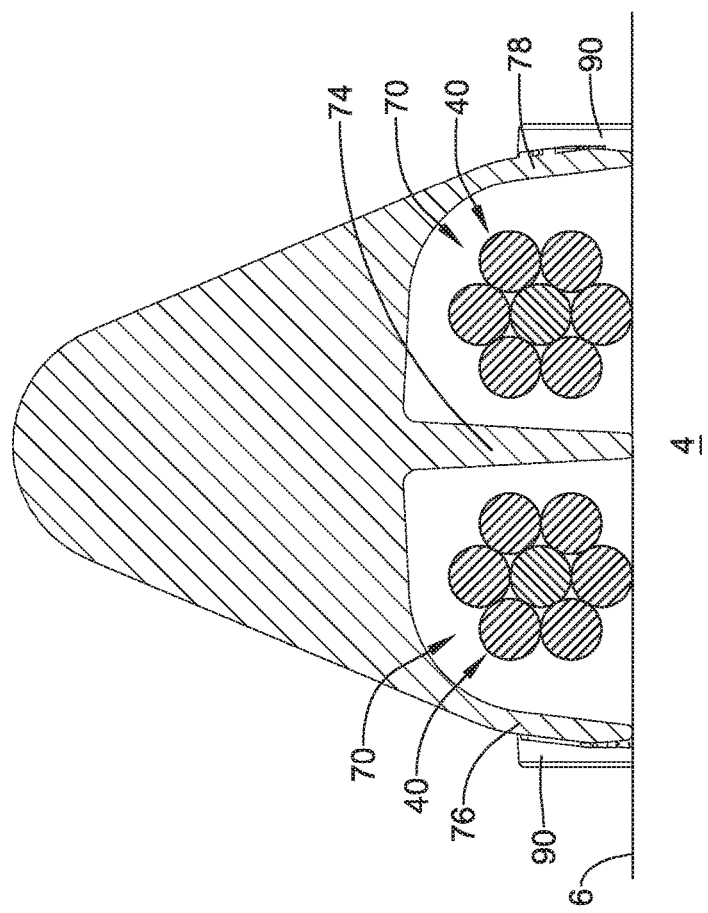
FIG. 4 is a cross-sectional view of the adjustable rope guide and grounding rope of FIG. 2.

FIG. 4 illustrates channels 70 provided in the rope guide 50 configured to receive the grounding ropes 40 for positioning along the conductive surface 6 of the rotating shaft 4. As can be seen from the figures, a first channel 70 may be defined between a first side wall 76 on the first side of the guide segment 52 and a divider wall 74, and a second channel 70 may be defined between a second side wall 76 on the second side of the guide segment 52 and the divider wall 74. The channels 70 may extend parallel to one another to position the grounding ropes 40 around a portion of the circumference of the rotating shaft 4. Thus, the channels 70 may open out to the bottom of the guide segments 52 facing the conductive surface 6 of the rotating shaft 4.

The shaft grounding apparatus 20 may be mounted proximate to the rotating shaft 4 to electrically ground the shaft 4 of the electric machine 2. For example, the grounding rope 40 may be placed in contact with the circumferential surface 6 of the rotating shaft 4. For instance, the grounding rope 40 may be draped over the rotating shaft 4 with the free second end 44 of the grounding rope 40 extending in the direction of rotation of the rotating shaft 4. It is noted that in some instances, multiple grounding ropes 40 (depending on the number of channels 70 provided in the rope guide 50) may be draped over the rotating shaft 4 to position the ropes 40 in contact with the surface 6 of the rotating shaft 4.

The adjustable rope guide 50 may also be positioned around a portion of the circumferential surface 6 of the rotating shaft 4 with the rope 40 extending along the channel 70 of the rope guide 50. In instances in which the rope guide 50 includes multiple channels 70, a rope 40 may be positioned in and extend along each channel 70 of the rope guide 50.

In order to accommodate the radius of curvature of the rotating shaft 4 such that the radius of curvature of the articulating segments 52 of the rope guide 50 closely matches the radius of curvature of the rotating shaft 4 and the lower edges of the articulating segments are positioned proximate the surface 6 of the rotating shaft 4, adjacent articulating segments 52 of the rope guide 50 may be pivoted relative to each other to adjust the radius of curvature of the adjustable rope guide 50. Thus, the rope(s) 40 may be circumferentially and/or axially constrained in the channel(s) 70 of the rope guide 50 along a portion of the circumference of the rotating shaft 4.

In some instances, the connector segment 56 and the articulating segments 52 of the rope guide 50 may be adjusted from a first minimum extent having a radius of curvature of 10 inches or less, 8 inches or less, or 6 inches or less to accommodate a similarly sized rotating shaft 4 to a second maximum extent having a radius of curvature of 10 inches or more, 12 inches or more, 14 inches or more, 16 inches or more, 18 inches or more, or 20 inches or more to accommodate a similarly sized rotating shaft 4. In some instances, the articulating segments 52 may be adjusted to extend substantially flat, thus accommodating rotating shafts 4 having an infinitely large diameter. Accordingly, through the adjustability of the rope guide 50, the rope guide 50 may be mounted to a range of sizes of rotating shafts 4, such as shafts 4 having diameters in the range of 6 to 36 inches, in the range of 6 to 24 inches, in the range of 6 to 20 inches, in the range of 6 to 18 inches, in the range of 6 to 16 inches, in the range of 6 to 14 inches, or in the range of 6 to 12 inches, in some instances.

Once the rope guide 50 has been adjusted to the desired radius of curvature to accommodate the diameter of the rotating shaft 4, the hinge points 62, 66 may be clamped to prevent further pivotable movement between adjacent guide segments 52, and between the connector segment 56 and the first guide segment 52a. Additional features of the rope guide 50, as well as the grounding rope 40, may be found in U.S. Patent Publication No. 2015/0070810 entitled GROUNDING ROPE FOR A SHAFT GROUNDING APPARATUS OF A DYNAMO-ELECTRIC MACHINE, filed on Sep. 9, 2014 and incorporated herein by reference in its entirety.

Accordingly, the rope guide 50 may guide the grounding rope(s) 40 along the rotating surface 6 of the rotating shaft 4. The grounding rope(s) 40 may be electrically grounded (e.g., connected to ground) to draw stray electrical voltage off of the rotating shaft 4 to prevent electrical current flow through bearings and/or other components of the electric machine 2 which could adversely affect the electric machine 2.

Figure 5:
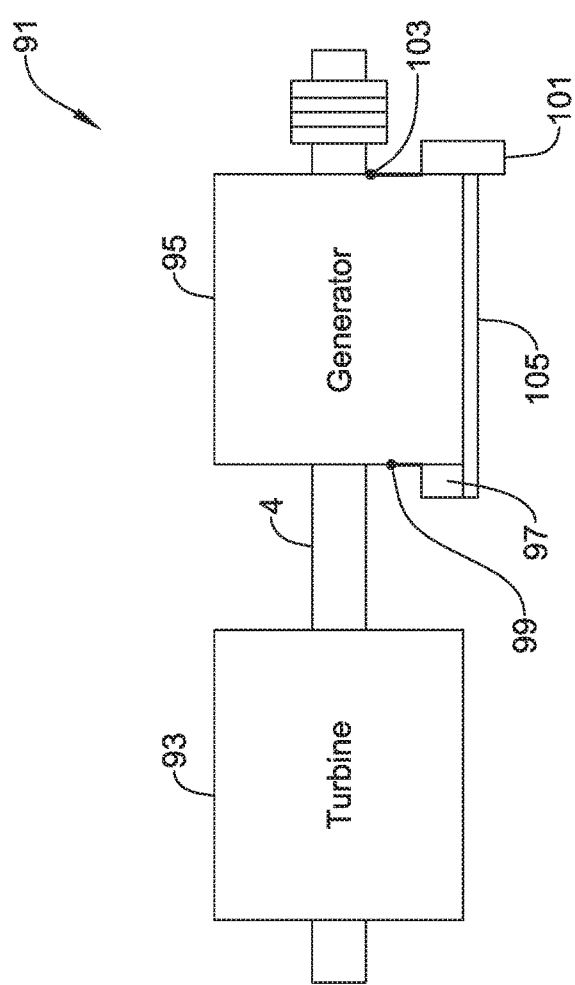
FIG. 5 is a schematic illustration of an electric generator incorporating at grounding monitoring system.

FIG. 5 is a schematic view of an electric generator 91 that may be considered as being representative of the electric machine 2. The electric generator 91 includes a turbine 93 and a generator 95. The rotating shaft 4 extends between the turbine 93 and the generator 95, and rotates therewith to transfer rotational energy between the turbine 93 and the generator 95. A constant monitoring signal acquisition assembly 97 is operably coupled with a shaft grounding assembly 99 that may, for example, be representative of the grounding assemblies discussed with respect to FIGS. 1-4. The constant monitoring signal acquisition assembly 97 may, for example, include one or more electrical sensors that are configured to sense one or more electrical parameters pertaining to stray voltages within the rotating shaft 4. A constant monitoring shaft monitoring assembly 101 is operably coupled with a shaft contact assembly 103 that may, for example, be in sliding contact with the rotating shaft 4 but not be in electrical contact with ground (i.e., electrically isolated from ground). The constant monitoring shaft monitoring assembly 101 may, for example, include one or more electrical sensors that are configured to sense one or more electrical parameters pertaining to stray voltages within the rotating shaft 4. A conduit 105 permits the constant monitoring signal acquisition assembly 97 to communicate with the constant monitoring shaft monitoring assembly 101 and in some cases allows the constant monitoring signal acquisition assembly 97 and/or the constant monitoring shaft monitoring assembly 101 to communicate with a remote control center, such as a remote control room or control board, for example.

Figure 6:
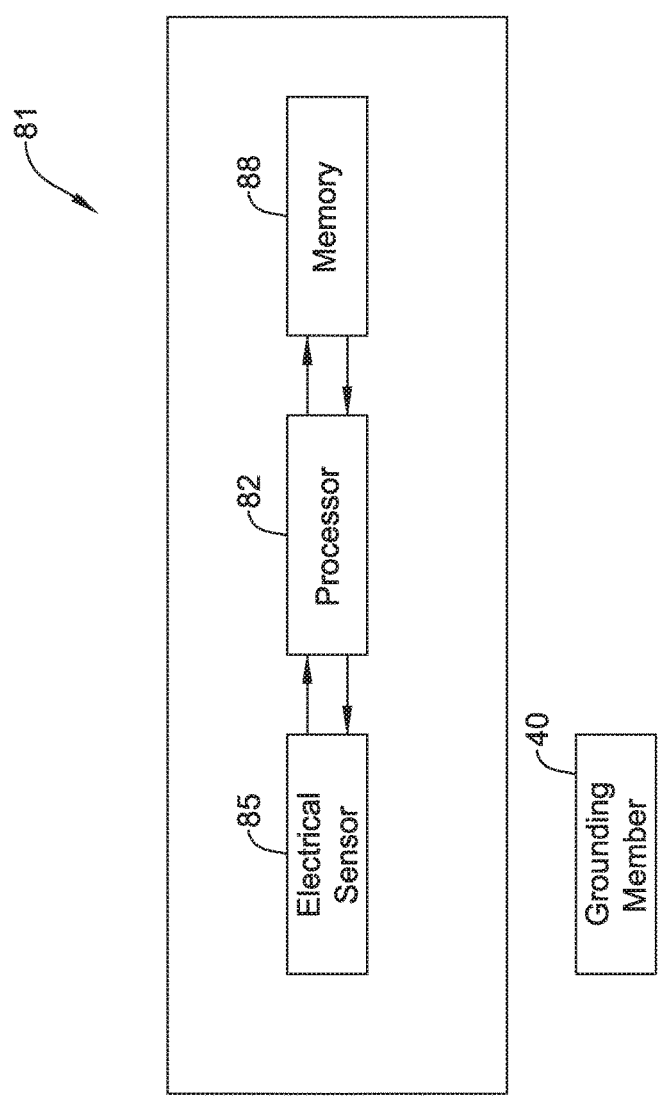
FIG. 6 is a schematic view of a monitoring system for a rotating shaft.

FIG. 6 is a schematic illustration of a monitoring system 81 in accordance with embodiments of the disclosure. In some cases, the monitoring system 81 may be included with the electric machine 2 (FIG. 1) and/or the electric generator 91 of FIG. 5. In some cases, the monitoring system 81 may be used with other devices that include a rotating shaft susceptible to stray voltages in the rotating shaft with or without a grounding apparatus. In some instances, the monitoring system 81 may be considered as being a stand-alone monitoring system or an add-on or retro-fit addition to the grounding apparatus described with respect to FIGS. 1-4. The monitoring system 81 includes a conductive member, such as the grounding member 40, that is configured to make sliding electrical contact with the rotating shaft 4 and that is configured to be connected to ground if used as a grounding member for the rotating shaft 4. An electrical sensor 85 is configured to be coupled with the grounding member 40 in order to detect an electrical parameter that provides an indication of electricity flowing from the rotating shaft 4 to ground through the grounding member 40. In some cases, the electrical sensor 85 is an electrical current sensor. In some cases, the electrical sensor 85 is an electrical voltage sensor.

A processor 82 is operably coupled with the electrical sensor 85 and is configured to receive and analyze data from the electrical sensor 85. In some instances, the electrical sensor 85 is configured to periodically provide the detected electrical parameter to the processor at a sampling rate and for a sampling period that is related to a rotation speed of the rotating shaft. In some cases, the electrical sensor 85 is configured to periodically sample for a sampling period of time (i.e., a sampling period), and then to not sample for a subsequent period of time (i.e., a non-sampling period). In other words, the electrical sensor 85 may be configured to sense an electrical parameter (e.g., current or voltage) for a sampling period directly followed by a non-sampling period in which the electrical parameter (e.g., current or voltage) is not being sampled). Thus, sampling periods may alternate with non-sampling periods. In some instances, each non-sampling period may be greater than each sampling period. For example, in some instances, each non-sampling period may be 5 time or more, 10 times or more, or 20 times or more, each sampling period.

A memory 88 is operably coupled with the processor 82 and is configured to store information processed by the processor 82 that is representative of data provided by the electrical sensor 85. In some cases, the memory 88 may represent short-term memory being used by the processor 82 for buffering incoming data from the electrical sensor 85. In some instances, the memory 88 may also be used for longer term storage of information that is representative of data provided by the electrical sensor 85.

In some cases, the electrical sensor 85 detects the electrical parameter at a sampling rate that provides enough data points per second to capture any anomalous or threshold condition that may be occurring. In some instances, the processor 82 accepts data from the electrical sensor 85 for a sampling period that covers one or more complete revolutions of the rotating shaft 4. In some instances, no data is collected from the electrical sensor 85 for a period of time directly after the sampling period (i.e., a non-sampling period), the period of time of the non-sampling period being longer than the sampling period. In some cases, the period of time during which no data is collected from the electrical sensor 85 is as long as or longer than the period of time for which data is collected from the electrical sensor 85. For instance, a snapshot of data from the electrical sensor 85 may be stored and analyzed by the processor 82 during a first time interval, directly followed by a second time interval in which the data from the electrical sensor 85 is not being stored and analyzed by the processor 82. These periods of time may be continuously repeated, resulting in periodic analysis of snapshots of data at temporally spaced apart time intervals. In some instances, the first time interval may be greater than or equal to the second time interval, or greater than the second time interval. In some instances, the first time interval may be less than or equal to the second time interval, or less than the second time interval. In some instances, the first time interval may be equal to the second time interval.

Figure 7:
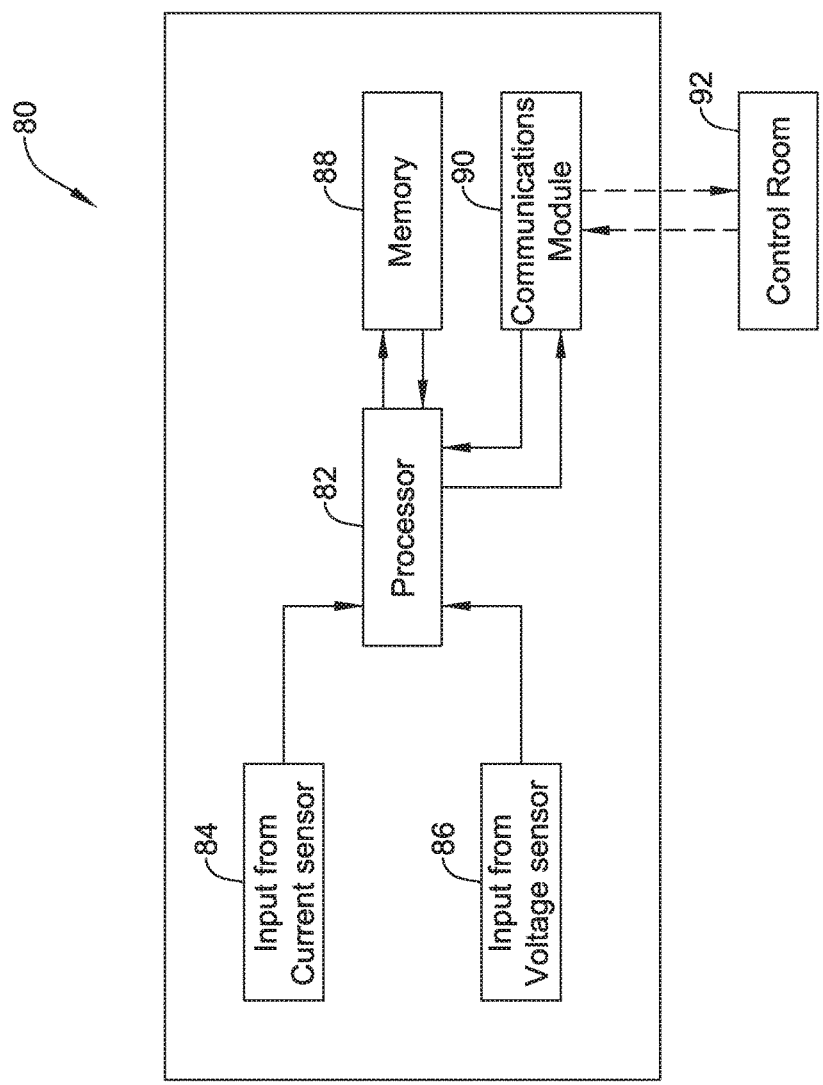
FIG. 7 is a schematic view of a monitoring system for a rotating shaft.

FIG. 7 is a schematic illustration of a monitoring system 80 in accordance with embodiments of the disclosure. In some cases, the monitoring system 80 may be built into the electric machine 2 (FIG. 1). In some cases, the monitoring system 80 may be used with other devices that include a rotating shaft susceptible to stray voltages in the rotating shaft with or without a grounding system. In some instances, the monitoring system 80 may be considered as being a stand-alone monitoring system or an add-on or retro-fit addition to the grounding apparatus described with respect to FIGS. 1-4. The monitoring system 80 includes the processor 82 that may be configured to receive data from a current sensor and thus may be operably coupled with an INPUT FROM CURRENT SENSOR 84. In some cases, the processor 82 may be configured to receive data from a voltage sensor and thus may be operably coupled with an INPUT FROM VOLTAGE SENSOR 86.

It will be appreciated that the INPUT FROM CURRENT SENSOR 84 and/or the INPUT FROM VOLTAGE SENSOR 86 may each independently represent a data channel providing data to the processor 82. The memory 88 may be operably coupled with the processor 82 and may, for example, be used to store, e.g., buffer, data provided directly from the INPUT FROM CURRENT SENSOR 84 and/or the INPUT FROM VOLTAGE SENSOR 86. In some cases, the memory 88 may also store data that has been processed by the processor 82 and thus may, for example, be representative of data that was provided from the INPUT FROM CURRENT SENSOR 84 and/or the INPUT FROM VOLTAGE SENSOR 86. A communications module 90 may be operably coupled to the processor 82 in order to communicate data to a location remote from the electric machine 2, such as a control room 92. In some cases, the communications module 90 may be used for receiving instructions and other data from the control room 92.

Figure 8:
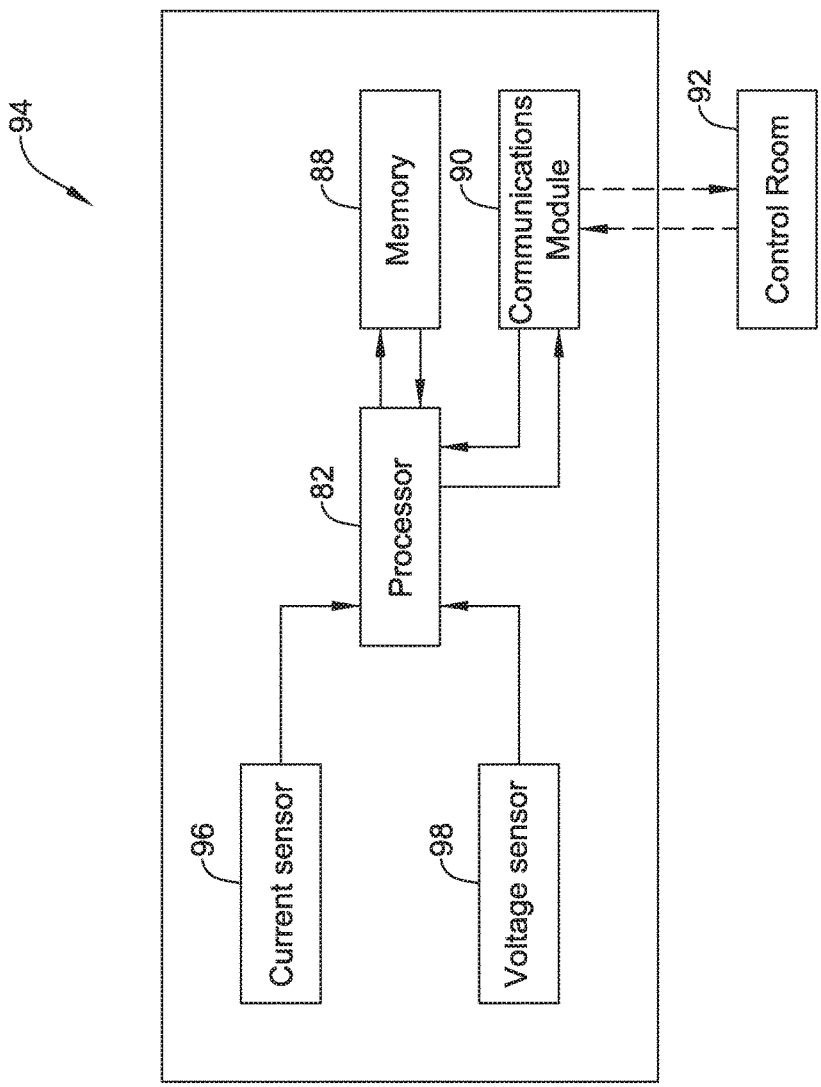
FIG. 8 is a schematic view of a monitoring system for a rotating shaft.

FIG. 8 is a schematic illustration of a monitoring system 94 in accordance with embodiments of the disclosure. In some cases, the monitoring system 94 may be included with the electric machine 2 (FIG. 1). In some cases, the monitoring system 94 may be used with other devices that include a rotating shaft susceptible to stray voltages in the rotating shaft with or without a grounding apparatus. In some instances, the monitoring system 94 may be considered as being a stand-alone monitoring system or an add-on or retro-fit addition to the grounding apparatus described with respect to FIGS. 1-4. The monitoring system 94 includes the processor 82 and the memory 88 that is operably coupled with the processor 82, much as described with respect to the monitoring system 80 illustrated in FIG. 7. The monitoring system 94 includes one or more sensors for sensing one or more electrical parameters, such as an electrical current sensor 96 and an electrical voltage sensor 98, each of which are operably coupled with the processor 82 such that the processor 82 may receive data from each of the current sensor 96 and the voltage sensor 98. The communications module 90 permits communication between the monitoring system 94 and the control room 92. The current sensor 96 may be any sensor that is configured to sense an electrical current. In some cases, the current sensor 96 may be a Hall effect sensor, but this is not required in all cases. The voltage sensor 98 may be any sensor that is configured to detect an electrical voltage.

In other instances, the monitoring system 94 may include only one of the current sensor 96 and the voltage sensor 98, and be configured to calculate an electrical voltage based on a sensed electrical current from the current sensor 96 or calculate an electrical current based on a sensed electrical voltage from the voltage sensor 98. For example, an electrical shunt having a 1 Ohm resistor may be used such that electrical current equals electrical voltage, as described below.

Figure 9:
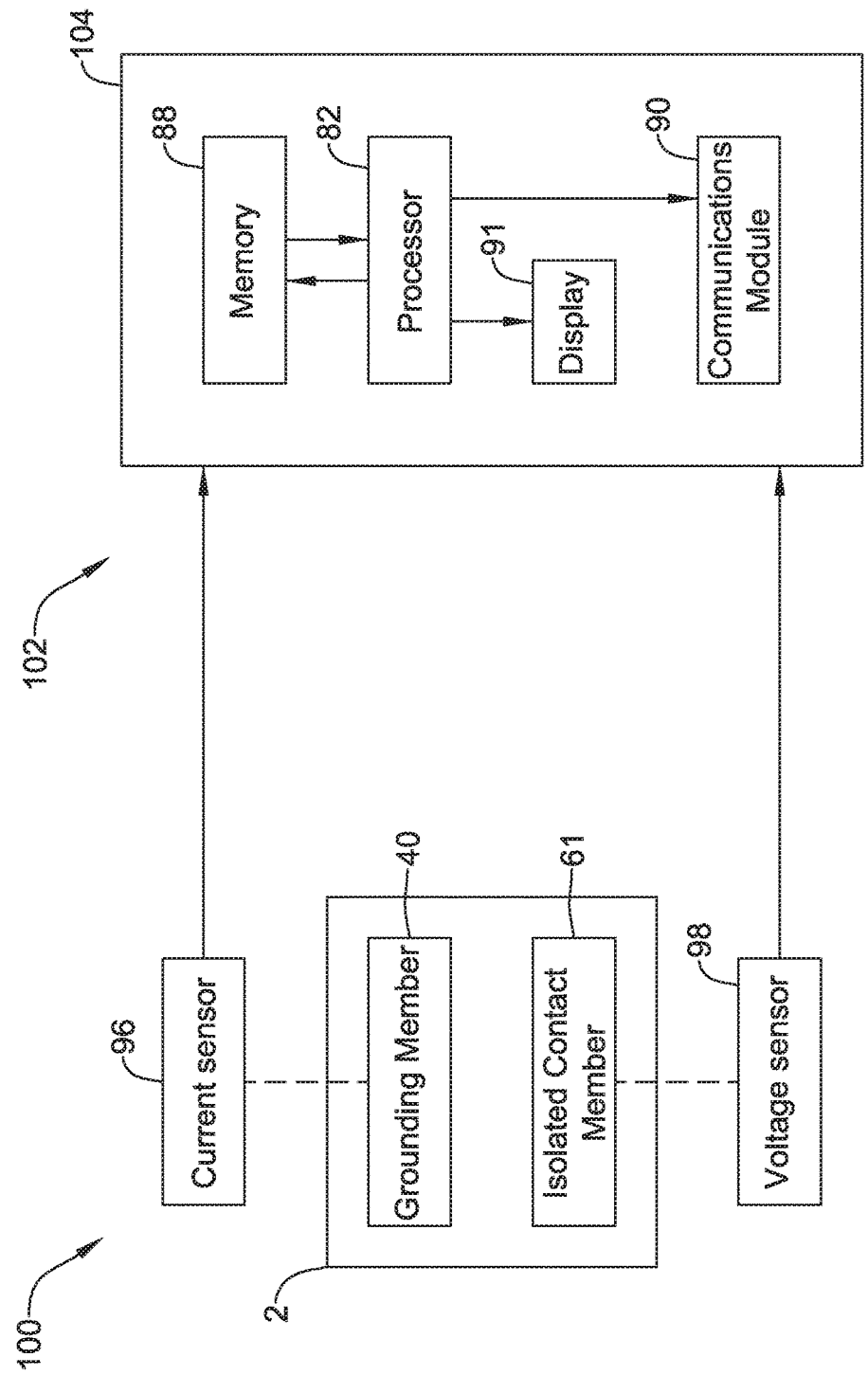
FIG. 9 is a schematic view of a shaft grounding and monitoring system for a rotating shaft.

FIG. 9 is a schematic illustration of an assembly 100 that includes the electric machine 2 (FIG. 1) in combination with a monitoring system 102. The monitoring system 102 includes the current sensor 96 disposed proximate or otherwise relative to the conductive grounding member 40 in such a way as to enable the current sensor 96 to sense or detect a current flowing in the grounding member 40. The monitoring system 102 also includes the voltage sensor 98 disposed proximate or otherwise relative to an isolated contact member 61 in such a way as to enable the voltage sensor 98 to sense or detect a voltage within the rotating shaft 4 (FIG. 1). In some instances, the isolated contact member 61 may be a second grounding rope 40 that is electrically isolated from ground. In some cases, the isolated contact member 61 may include an electrical shunt that is connected with the grounded grounding rope 40. In some cases, a shunt may be used to determine current and/or voltage. It will be appreciated that since there is a well-known relationship between current and voltage, an appropriately sized shunt may permit determination of current and voltage, particularly if a 1 ohm shunt is utilized. In some cases, the voltage sensor 98 may be a single voltage sensor or may be a pair (or more) of distinct voltage sensors, and may be configured to sense or detect a voltage within the rotating shaft 4 at two different locations on the rotating shaft 4, such as but not limited to a turbine end and an exciter end of the rotating shaft 4.

The monitoring system 102 may, for example, include a processing module 104 that houses the processor 82, the memory 88 and the communications module 90 as discussed with respect to FIGS. 7 and 8. It is contemplated that in some cases, the processing module 104 may include a display 91 that is operably coupled to the processor 82 such that sensed electrical voltages and/or current data, errors and/or warnings pertaining to potential anomalous or threshold conditions may be visibly displayed, for example.

In some cases, the processor 82 may be configured to analyze a snapshot of data from a first electrical sensor sensing a first electrical parameter, such as the current sensor 96 in order to look for potential anomalous or threshold conditions. In some cases, the first electrical sensor may instead be a voltage sensor. A snapshot of data may be defined as data collected over a particular length of time, such as a second, or a fraction of a second. In some cases, a snapshot of data from the first sensor (e.g., the current sensor 96) may be collected or otherwise recorded for a first interval of time (i.e., first sampling period) and buffered in short term memory and a snapshot of data from the second sensor (e.g., the voltage sensor 98) may be collected or otherwise recorded and buffered in short term memory for a second interval of time (i.e., second sampling period). The second interval of time may be different than (e.g., shorter than or longer than) the first interval of time. The second interval of time may at least partially overlap with the first interval of time. In some instances, the second interval of time falls completely within the first interval of time. In some instances, the first sensor may be the voltage sensor 98 and the second sensor may be the current sensor 96.

In some instances, a potential anomalous or threshold condition may be a current spike that lasts longer than a particular length of time, or perhaps a current spike that reaches a current level that exceeds a threshold current value. These thresholds may be programmed into the processor 82, or may be manually entered into the monitoring system 102. In some cases, a potential anomalous or threshold condition may not be related to a current spike, but may instead pertain to an instruction received from the control room 92 (FIG. 6), requesting additional information from the monitoring system 102.

If the analysis of the snapshot of data from the current sensor 96 does not indicate any potential anomalous or threshold conditions that are worthy of further investigation, the processor 82 may calculate one or more values that are representative of the snapshot, and may save the one or more representative values to the memory 88. Any variety of representative values may be calculated and saved. For example, the processor 82 may calculate an average current value and/or a peak current value. In some cases, the processor 82 may also conduct waveform analysis of the snapshot of data from the current sensor 96 in order to look for particular patterns that indicate particular issues. For example, a saw tooth waveform with a slow rise and subsequent rapid discharge can indicate the build-up and release of static electricity on the shaft 4.

Conversely, if the snapshot of data from the current sensor 96 does indicate one or more potential anomalous or threshold conditions, the processor 82 may save the snapshot of data from the current sensor 86 to the memory 88, and may then analyze a corresponding snapshot of data from a second electrical sensor such as the voltage sensor 98. In some cases, analyzing a corresponding snapshot of data from the voltage sensor 98 includes retrieving the data from a buffer that temporarily stores the data as it is provided by the voltage sensor 98, and in particular, retrieving data from a specific time interval that falls at least partially within the time interval corresponding to the snapshot of data from the current sensor 96. In some cases, the first electrical sensor may instead be a voltage sensor and the second electrical sensor may instead be a current sensor, if desired. It will be appreciated that in some cases, particularly if the voltage sensor 98 is sampling at a higher sampling rate, that the snapshot of data from the voltage sensor 98 may include additional information pertaining to an anomalous or threshold condition seen in the snapshot of data from the current sensor 96.

In some cases, the current sensor 96 may be configured to sample at a first sampling rate and the voltage sensor 98 may be configured to sample at a second sampling rate that is higher than the first sampling rate. In some instances, a first electrical sensor such as the current sensor 96 may sample essentially continuously at the first sampling rate while a second electrical sensor such as the voltage sensor 98 may sample periodically at the second sampling rate. Continuous sampling may be defined as sampling over a relatively long period of time. It will be appreciated that strictly speaking, digital sampling, as opposed to analog sampling, occurs as distinct samples occurring very rapidly one after another. For the purposes of this disclosure, digital sampling will be referred to as being continuous if it occurs over a relatively long period of time. Continuous sampling may also be defined as sampling that occurs at a sampling rate that is fast enough to reliably witness or otherwise capture data pertaining to a majority of potential recurring events. This contrasts with periodical sampling, such as may be done via the voltage sensor 98, which may sample at a high sampling rate for a short period of time, followed by a period of time without sampling, followed by a short period of sampling again, and so on. In some instances, the period of time without sampling may be longer than the short period of time while sampling.

In some cases, the sampling period (how long the current sensor 96 and/or the voltage sensor 98 samples) may be at least a function of how rapidly the rotating shaft 4 is rotating. Because events pertaining to a rotating shaft are cyclic in nature, in some cases a sampling period may be defined in terms of how long it takes for the rotating shaft 4 to make at least one complete revolution, or perhaps several complete revolutions. In some cases, the sampling rate may be a function of how frequently it is necessary to sample in order to catch any significant event occurring with respect to stray voltages exiting the rotating shaft 4. In some cases, particularly for the current sensor 96, this may mean sampling at a sampling rate of 100 samples per second or more, or perhaps at a sampling rate of 1000 samples per second or more.

In some embodiments, the current sensor 96 may be programmed or otherwise configured to sample (detect current) at a first sampling rate that ranges from about 10 kiloHz (kHz) to about 200 kHz, meaning 10,000 samples per second to about 200,000 samples per second. In some cases, the current sensor 96 may be programmed or otherwise configured to sample at a first sampling rate that ranges from about 50 kHz (50,000 samples per second) to about 150 kHz (150,000 samples per second). In a particular example, the current sensor 96 may be programmed or otherwise configured to sample at a first sampling rate that is about 100 kHz (100,000 samples per second) or more. In other examples, the current sensor 96 may be programmed or otherwise configured to sample at a first sampling rate that is about 10 kHz (10,000 samples per second) or more, about 20 kHz (20,000 samples per second) or more, about 40 kHz (40,000 samples per second) or more, about 60 kHz (60,000 samples per second) or more, about 80 kHz (80,000 samples per second) or more, about 120 kHz (120,000 samples per second) or more, about 140 kHz (140,000 samples per second) or more, about 160 kHz (160,000 samples per second) or more, about 180 kHz (180,000 samples per second) or more, or, about 200 kHz (200,000 samples per second) or more. It will be appreciated that the first sampling rate may vary, depending on a variety of variables including but not limited to the rotating speed of the rotating shaft 4.

In some embodiments, the voltage sensor 98 may be programmed or otherwise configured to sample (detect voltage) periodically. In some cases, the voltage sensor 98 may turn itself on for a brief period of time to sample, then turn itself off for a subsequent period of time in which the voltage sensor 98 does not sample. In some cases, the voltage sensor 98 may stay on, and the processor 82 may, for example, analyze data coming from the voltage sensor 98 for a brief period of time corresponding to the sampling time (i.e., sampling period), followed by a subsequent period of time in which the processor 82 ignores or otherwise does not analyze the data coming from the voltage sensor 98 (i.e., non-sampling period).

For example, the voltage sensor 98 may be programmed or otherwise configured to sample at the second sampling rate intermittently, such as for a fraction of a second per each second (i.e., for only a portion of each second). In some cases, the voltage sensor 98 may be programmed or otherwise configured to sample for about 0.02 seconds per each second to about 0.1 seconds per each second (i.e., sampling period), thereby ensuring data from at least one complete revolution for a shaft revolving at 3600 RPM. In some cases, the voltage sensor 98 may be programmed or otherwise configured to sample at the second sampling rate for a period of time ranging from 0.01 seconds per each second to 0.5 seconds per each second. It will be appreciated that in this case, the voltage sensor 98 is not sampling for a subsequent period of time (i.e., a non-sampling period) ranging from 0.5 seconds per each second to 0.99 seconds per each second. In some cases, the voltage sensor 98 may be programmed or otherwise configured to sample at the second sampling rate for a period of time ranging from 0.05 seconds per each second to 0.25 seconds per each second. In this case, the voltage sensor 98 is not sampling for a subsequent period of time (i.e., a non-sampling period) ranging from 0.75 seconds per each second to 0.95 seconds per each second. In a particular example, the voltage sensor 98 may be programmed or otherwise configured to sample at the second sampling rate for a period of time ranging of about 0.1 seconds per each second. In this case, the voltage sensor 98 may be programmed or otherwise configured to not sample for a subsequent period of time (i.e., a non-sampling period) of about 0.9 seconds per each second. In some examples, the voltage sensor 98 may be programmed or otherwise configured to sample at the second sampling rate for about 50% or less, about 40% or less, about 30% or less, about 25% or less, about 20% or less, about 15% or less, about 10% or less, or about 5% or less of each second.

When sampling, the voltage sensor 98 may be programmed or otherwise configured to sample at a second sampling rate that ranges from 10 megaHz (MHz) to 100 MHz (10,000,000 samples per second to 100,000,000 samples per second). In some cases, the voltage sensor 98 may be programmed or otherwise configured to sample at a second sampling rate that ranges from 20 MHz (20,000,000 samples per second) to 80 MHz (80,000,000 samples per second). In a particular example, the voltage sensor 98 may be programmed or otherwise configured to sample at a second sampling rate that is about 20 MHz (20,000,000 samples per second) or more. In another particular example, the voltage sensor 98 may be programmed or otherwise configured to sample at a second sampling rate of about 40 MHz (40,000,000 samples per second) or more. In other examples, the voltage sensor 98 may be programmed or otherwise configured to sample at a second sampling rate that is about 10 MHz (10,000,000 samples per second) or more, 30 MHz (30,000,000 samples per second) or more, 50 MHz (50,000,000 samples per second) or more, 60 MHz (60,000,000 samples per second) or more, 80 MHz (80,000,000 samples per second) or more, or 100 MHz (100,000,000 samples per second) or more.

In some cases, even if no potential anomalous or threshold condition is seen in analyzing the snapshot of data from the current sensor 96, the corresponding snapshot of data from the voltage sensor 98 will still be analyzed by the processor 82. It will be appreciated that the snapshot of data from the voltage sensor 98 will at least partially temporally overlap the snapshot of data from the current sensor 96. In some cases, the snapshot of data from the voltage sensor 98 will temporally fit entirely within the snapshot of data from the current sensor 96. For example, if the snapshot of data from the current sensor 96 represents one second of time, the snapshot of data from the voltage sensor 96 may represent a fraction or portion of that same second of time.

In some cases, some transient events may be too short-lived to be visible in the current data that is sampled at the first sampling rate but may be caught in the voltage data that is sampled at the second, higher sampling rate. If a potential event is seen, the snapshot of data from the voltage sensor 98 may be saved into the memory 88 for subsequent study. If no potential event is seen, the processor 82 may calculate one or more values that are representative of the snapshot, and may save the one or more representative values to the memory 88. Any variety of representative values may be calculated and saved. For example, the processor 82 may calculate an average voltage value and/or a peak voltage value. In some cases, the processor 82 may also conduct waveform analysis of the snapshot of data from the voltage sensor 98 in order to look for particular patterns that indicate particular issues. For example, a saw tooth waveform with a slow rise and subsequent rapid discharge indicates the build-up and release of static electricity.

Figure 10:
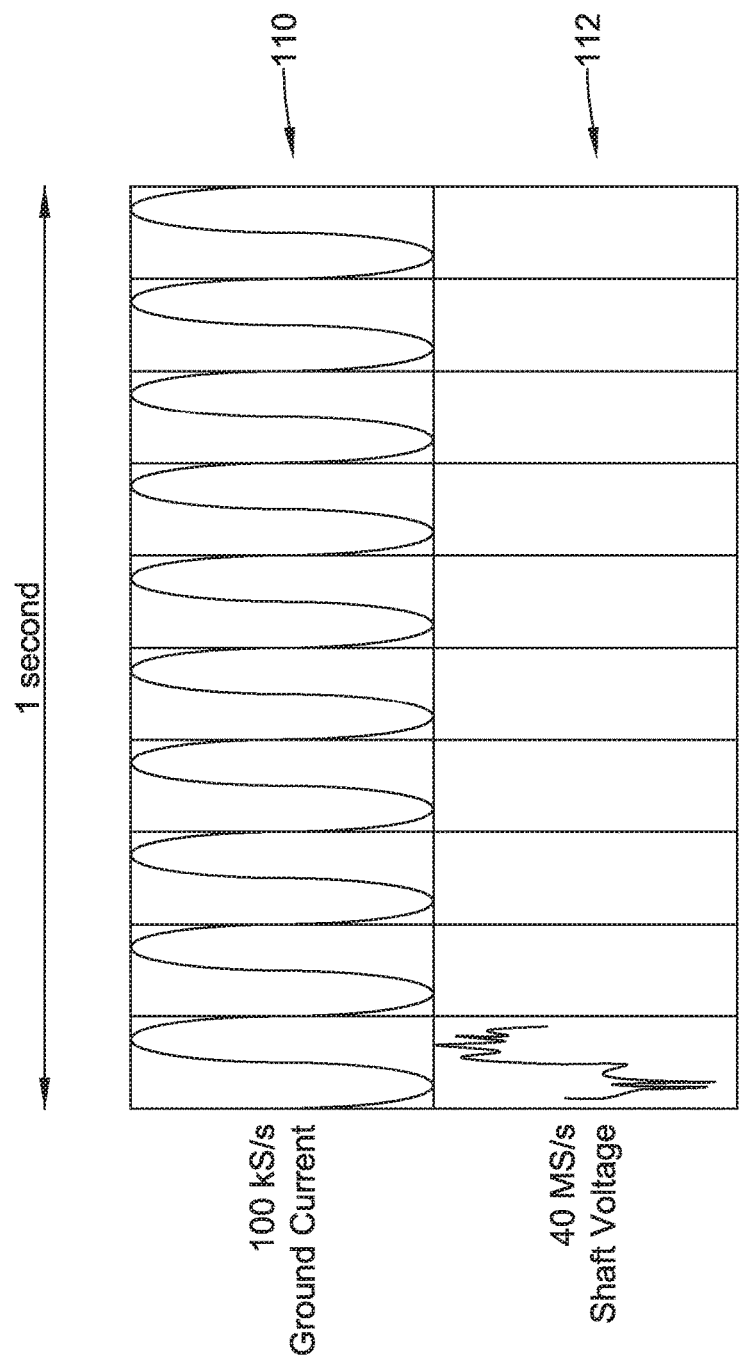
FIG. 10 is a graphical representation of illustrative current and voltage data.

FIG. 10 is a graphical representation of illustrative sampling rates and corresponding data collected over a one second period of time. It is understood that this graphical representation would be repeated for subsequent periods of time. The upper graph 110 shows a current sampling rate of 100 kHz (100,000 data points or samples per second) and is indicative of data that may, for example, be collected continuously by the current sensor 96. The lower graph 112 shows a voltage sampling rate of 40 MHz (40,000,000 data points or samples per second), but only for $\frac{1}{10}^{th}$ of a second (i.e. for 0.1 seconds of each second) and is indicative of data that may, for example, be collected by the voltage sensor 98 intermittently or periodically. It will be appreciated that because the rotating shaft 4 (FIG. 1) is in fact rotating, that any potential event will likely repeat itself. For a rotating shaft 4 that is rotating at 3600 RPM, the $\frac{1}{10}^{th}$ of a second that voltage data is collected still represents six full shaft rotations. Similarly, for a shaft rotating at 1800 RPM, a $\frac{1}{10}^{th}$ of a second represents three full shaft rotations, or one full shaft rotation for a shaft rotating at 600 RPM. It will be appreciated that the sampling rates and/or the relative duration of time that voltage data is collected may vary in accordance with shaft rotation speed. In some cases, the sampling rates and/or the relative duration of time that voltage data is collected may increase in order to obtain additional data regarding a particular event once that particular event has been identified or suspected.

Figure 11:
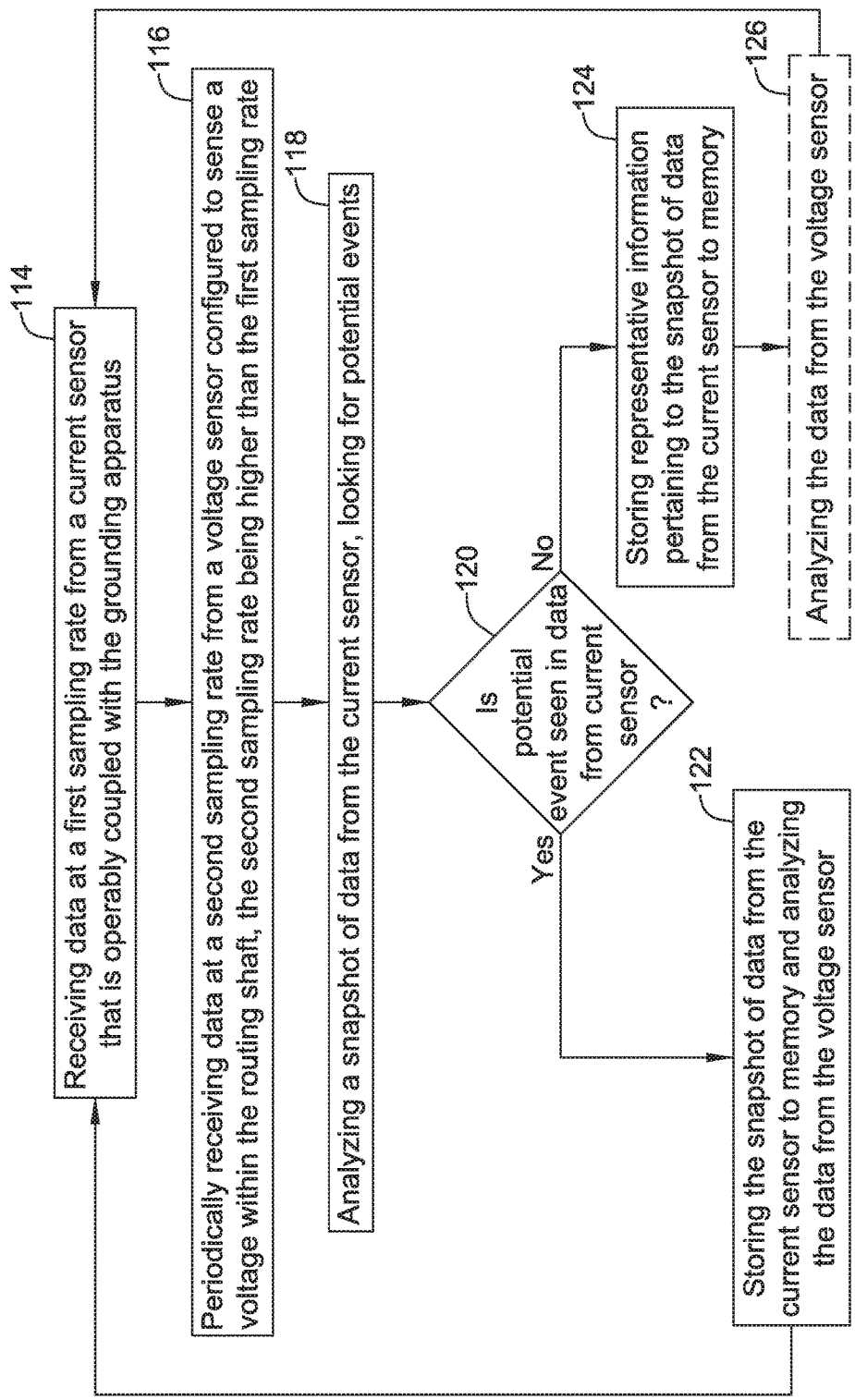
FIG. 11 is a flow diagram showing an illustrative method.

FIG. 11 is a flow diagram showing a method of monitoring stray electricity in and/or grounding performance for a rotating conductive shaft (such as the rotating shaft 4 shown in FIG. 1) in a device (such as the electrical machine 2 shown in FIG. 1) that includes a grounding apparatus. As generally indicated at block 114, data may be continuously received at a first sampling rate from a current sensor (such as the current sensor 96) that is operably coupled with the grounding apparatus. Data may be periodically or intermittently received at a second sampling rate from a voltage sensor (such as the voltage sensor 98) configured to sense a voltage within the rotating shaft, the second sampling rate being higher than the first sampling rate, as indicated at block 116. As seen at block 118, a snapshot of data from the current sensor may be analyzed, looking for potential events such as anomalous or threshold conditions.

A determination is made at decision block 120 as to whether a potential anomalous or threshold condition is seen in the data from the current sensor. This decision may pertain to whether a current value exceeds a threshold value in duration and/or magnitude. This decision may also pertain to whether an external request for analysis has been received. If YES, the snapshot of data from the current sensor is saved to memory (such as the memory 88) and the data from the voltage sensor is analyzed as seen at block 122. If NO, representative information pertaining to the snapshot of data from the current sensor is saved to memory, as generally indicated at block 124. Illustrative but non-limiting examples of representative information pertaining to the snapshot of data form the current sensor includes an average current and/or a peak current. In some cases, as seen at block 126, the voltage data may be analyzed even if there was no potential event seen in the current data. In some cases, data from the current sensor may be periodically or intermittently sampled while data from the voltage sensor may be continuously sampled.

Those skilled in the art will recognize that the present invention may be manifested in a variety of forms other than the specific embodiments described and contemplated herein. Accordingly, departure in form and detail may be made without departing from the scope and spirit of the present invention as described in the appended claims.

What is claimed is:

1. A shaft grounding and monitoring system for a device having a rotating shaft, the shaft grounding and monitoring system comprising:
   a grounding member configured to make sliding electrical contact with the rotating shaft, the grounding member configured to be connected to ground;

an electrical sensor configured to sense an electrical parameter that provides an indication of electricity flowing through the grounding member, a processor operably coupled with the electrical sensor, the processor configured to receive and analyze data from the electrical sensor representing the electrical parameter;

the processor is further configured to periodically analyze the data representing the electrical parameter from the electrical sensor for a sampling period and to not analyze the data representing the electrical parameter for a period of time immediately after the sampling period, where the sampling period is related to a rotation speed of the rotating shaft; and a memory operably coupled with the processor and configured to store data processed by the processor that is representative of the data provided by the electrical sensor.

2. The shaft grounding and monitoring system of claim 1, wherein the electrical sensor comprises an electrical current sensor or an electrical voltage sensor.

3. The shaft grounding and monitoring system of claim 1, wherein the electrical sensor detects the electrical parameter at a sampling rate that provides enough data points per second to capture any anomalous or threshold condition that may be occurring in the device.

4. The shaft grounding and monitoring system of claim 1, wherein the sampling period is equal to or greater than one complete revolution of the rotating shaft.

5. The shaft grounding and monitoring system of claim 1, wherein the period of time immediately after the sampling period in which the processor does not analyze the data representing the electrical parameter is longer than the sampling period in which the processor analyzes the data representing the electrical parameter.

6. The shaft grounding and monitoring system of claim 1, wherein the processor is configured to analyze the data representing the electrical parameter from the electrical sensor for a sampling period ranging from 0.01 seconds per each second to 0.5 seconds per each second, and the processor is configured to not analyze the data representing the electrical parameter from the electrical sensor for a subsequent time period ranging from 0.5 seconds per each second to 0.99 seconds per each second.

7. The shaft grounding and monitoring system of claim 1, wherein the processor is configured to analyze the data representing the electrical parameter from the electrical sensor for a sampling period ranging from 0.05 seconds per each second to 0.25 seconds per each second, and the processor is configured to not analyze the data representing the electrical parameter from the electrical sensor for a subsequent time period ranging from 0.75 seconds per each second to 0.95 seconds per each second.

8. The shaft grounding and monitoring system of claim 1, wherein the processor is configured to analyze the data representing the electrical parameter from the electrical sensor for a sampling period of 0.1 seconds per each second, and the processor is configured to not analyze the data representing the electrical parameter from the electrical sensor for a subsequent time period of 0.9 seconds per each second.

9. A monitoring system for a device having a rotating shaft and a grounding member positioned in electrical contact with the rotating shaft, the monitoring system comprising:

a current sensor configured to sense an electrical current flowing through the grounding member, the current sensor configured to sample at a first sampling rate for a first time interval;

a voltage sensor configured to sense an electrical voltage in the rotating shaft, the voltage sensor configured to periodically sample at a second sampling rate for a second time interval, wherein the second sampling rate is higher than the first sampling rate and the first time interval is longer than the second time interval and overlapping with the second time interval;

a processor operably coupled with the current sensor and with the voltage sensor and configured to receive data indicative of electrical current sensed by the current sensor and data indicative of electrical voltage sensed by the voltage sensor;

the processor configured to analyze the data from the current sensor and the data from the voltage sensor; and a memory operably coupled with the processor and configured to store information representative of the data from the current sensor and the data from the voltage sensor.

10. The monitoring system of claim 9, wherein the first sampling rate is about 100 kHz or greater.

11. The monitoring system of claim 9, wherein the voltage sensor is configured to sample for about two-hundredths to about one-tenth of each second.

12. The monitoring system of claim 9, wherein the second sampling rate is about 20 MHz or more when sampling.

13. The monitoring system of claim 9, wherein the processor is further configured to analyze a snapshot of data from the current sensor during a sampling period in order to identify a potential anomalous or threshold condition.

14. The monitoring system of claim 13, wherein if the processor does not identify a potential anomalous or threshold condition from the snapshot of data from the current sensor, the processor is further configured to store one or more values representative of the snapshot of data from the current sensor to memory.

15. The monitoring system of claim 9, wherein if the processor does identify a potential anomalous or threshold condition from the snapshot of data from the current sensor, the processor is further configured to store one or more values representative of the snapshot of data from the current sensor to memory and to analyze a temporally aligned snapshot of data from the voltage sensor in order to provide additional information regarding the potential anomalous or threshold condition.

16. A shaft grounding and monitoring system for a device having a rotating shaft, the shaft grounding and monitoring system comprising:

a grounding member configured to slidingly contact the rotating shaft and make electrical contact with the rotating shaft, the grounding member configured to be connected to ground;

an isolated contact member configured to slidingly contact the rotating shaft, the isolated contact member electrically isolated from ground; and the monitoring system of claim 9;

wherein the current sensor is coupled with the grounding member in order to sense an electrical current flowing from the rotating shaft to ground through the grounding member and the voltage sensor is coupled with the isolated contact member in order to sense an electrical voltage in the shaft.

17. A method of monitoring a rotating conductive shaft in a device including a grounding apparatus, the method comprising:

receiving data at a first sampling rate during a first sampling period from a current sensor that is operably coupled with the grounding apparatus;

periodically receiving data at a second sampling rate during a second sampling period from a voltage sensor configured to sense a voltage within the rotating shaft, the second sampling rate being higher than the first sampling rate;

analyzing a snapshot of data from the current sensor to identify a potential anomalous or threshold condition; and if a potential anomalous or threshold condition is seen in the snapshot of data from the current sensor, analyzing a snapshot of data from the voltage sensor;

wherein the snapshot of data from the voltage sensor that is analyzed at least partially temporally aligns with the snapshot of data from the current sensor that was analyzed.

18. The method of claim 17, wherein if a potential anomalous or threshold condition is seen in the snapshot of data from the current sensor, storing the snapshot of data from the current sensor for future analysis.

19. The method of claim 17, wherein if a potential anomalous or threshold condition is not seen in the snapshot of data from the current sensor, storing representative information pertaining to the snapshot of data from the current sensor to memory.

20. The method of claim 17, wherein the first sampling period at least partially temporally overlaps the second sampling period.

\* \* \* \* \*